United States Patent
Lee et al.

(10) Patent No.: US 8,677,166 B2
(45) Date of Patent: Mar. 18, 2014

(54) SEMICONDUCTOR DEVICES AND SYSTEMS-ON-CHIP HAVING THE SAME

(75) Inventors: Heon-Hee Lee, Hwaseong-si (KR); Hoi-Jin Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 406 days.

(21) Appl. No.: 13/084,924

(22) Filed: Apr. 12, 2011

(65) Prior Publication Data

US 2011/0320843 A1 Dec. 29, 2011

(30) Foreign Application Priority Data

Jun. 24, 2010 (KR) .................. 10-2010-0059809

(51) Int. Cl.
*G06F 1/00* (2006.01)
*H03L 5/00* (2006.01)

(52) U.S. Cl.
USPC ........... 713/323; 713/300; 713/310; 713/320; 713/322; 716/104; 716/106; 327/309; 327/313; 327/314; 327/315; 327/317

(58) Field of Classification Search
USPC .......... 713/300, 310, 320, 322, 323; 716/104, 716/106; 327/309, 313, 314, 315, 317
See application file for complete search history.

(56) References Cited

U.S. PATENT DOCUMENTS

| | | | | |
|---|---|---|---|---|
| 6,137,338 A * | 10/2000 | Marum et al. | ................. | 327/318 |
| 6,208,171 B1 * | 3/2001 | Kumagai et al. | ............... | 326/121 |
| 2003/0202311 A1 * | 10/2003 | Duvvury | ........................ | 361/111 |
| 2006/0012545 A1 * | 1/2006 | Kishi et al. | ....................... | 345/60 |
| 2007/0210857 A1 * | 9/2007 | Wu et al. | ........................ | 327/541 |
| 2009/0027099 A1 * | 1/2009 | Howard et al. | ............... | 327/309 |
| 2009/0315399 A1 * | 12/2009 | Shikata | ........................... | 307/38 |
| 2010/0231255 A1 * | 9/2010 | Kim et al. | ....................... | 326/33 |

FOREIGN PATENT DOCUMENTS

| | | |
|---|---|---|
| JP | 2003-032097 A | 1/2003 |
| KR | 10-0703720 B1 | 3/2007 |
| KR | 20080067039 A | 7/2008 |

* cited by examiner

*Primary Examiner* — Kim Huynh
*Assistant Examiner* — Zahid Choudhury
(74) *Attorney, Agent, or Firm* — Harness, Dickey & Pierce, P.L.C.

(57) ABSTRACT

A semiconductor device includes a power gating unit, a combinational logic unit and a clamping unit. The power gating unit is turned on to output an internal signal at an output electrode based on an input signal or turned off according to operation modes. The combinational logic unit includes an input electrode directly connected to the output electrode of the power gating unit through a data line, and generates an output signal based on the internal signal received through the data line. The clamping unit is turned on to clamp the internal signal at a logic high level or at a logic low level or turned off according to the operation modes. The semiconductor device clamps the output electrode of the power gating unit without degrading an operation speed of the semiconductor device.

14 Claims, 20 Drawing Sheets

US 8,677,166 B2

SEMICONDUCTOR DEVICES AND SYSTEMS-ON-CHIP HAVING THE SAME

CROSS-REFERENCE TO RELATED APPLICATION(S)

This application claims priority under 35 U.S.C. §119 to Korean Patent Application No. 10-2010-0059809, filed on Jun. 24, 2010 in the Korean Intellectual Property Office (KIPO), the entire contents of which are herein incorporated by reference.

BACKGROUND

1. Technical Field

Example embodiments relate to semiconductor devices, and more particularly to semiconductor devices having a power gating unit and systems-on-chip including the semiconductor devices.

2. Description of the Related Art

A system-on-chip includes a power gating unit, which is turned on or turned off according to operation modes, for reducing power consumption. Generally, the power gating unit includes a logic block and a switch that controls a flow of current from a supply voltage to a ground voltage through the logic block. The switch is turned on in a normal mode to operate the logic block by passing the current through the logic block and is turned off in a standby mode to block the current for reducing power consumption.

If the switch is turned off, an output signal of the power gating unit is floated. That is, a logic level of the output signal of the power gating unit is not determined as a logic low level or a logic high level.

Conventionally, an isolation cell is inserted between the power gating unit and the combinational logic unit to provide a signal having a predetermined logic level to the combinational logic unit even if the power gating unit is turned off. However, an operation speed of the system-on-chip having the isolation cell is slowed since a signal is delayed by an insertion of the isolation cell.

SUMMARY

Example embodiments are directed to provide a semiconductor device that clamps an output signal of a power gating unit without degrading an operation speed.

Example embodiments are directed to provide a system-on-chip that includes the semiconductor device.

According to example embodiments, a semiconductor device includes a power gating unit, a combinational logic unit and a clamping unit. The power gating unit is turned on to output an internal signal at an output electrode based on an input signal or turned off according to operation modes. The combinational logic unit includes an input electrode directly connected to the output electrode of the power gating unit through a data line, and generates an output signal based on the internal signal received through the data line. The clamping unit is turned on to clamp the internal signal at a logic high level or at a logic low level or turned off according to the operation modes.

In example embodiments, the clamping unit may be connected between the data line and a ground voltage, and the clamping unit may turn off in a first operation mode and turn on to clamp the internal signal at the logic low level in a second operation mode.

The power gating unit may include at least one logic block connected in series, where each of the at least one logic block is connected to the ground voltage, and a power switch connected between each of the at least one logic block and a supply voltage, where the power switch is closed in the first operation mode and is opened in the second operation mode in response to a power control signal.

The power gating unit may include at least one logic block connected in series, where each of the at least one logic block except for a last logic block connected in a last stage among the at least one logic block is connected to a supply voltage, a first power switch connected between each of the at least one logic block and the ground voltage, where the first power switch is closed in the first operation mode and is opened in the second operation mode in response to a first power control signal, and a second power switch connected between the last logic block and the supply voltage, where the second power switch is closed in the first operation mode and is opened in the second operation mode in response to a second power control signal.

The clamping unit may include a first clamp switch connected to the data line, where the first clamp switch is closed or opened in response to a first control signal, and a second clamp switch connected between the first clamp switch and the ground voltage, where the second clamp switch being closed or opened in response to a second control signal.

The first clamp switch and the second clamp switch may close at different times separated by an interval of a first reference period, and open at different times separated by an interval of a second reference period in the second operation mode.

The first clamp switch may include a first NMOS transistor having a source, a drain connected to the data line and a gate to which the first control signal is applied, and the second clamp switch may include a second NMOS transistor having a source connected to the ground voltage, a drain connected to the source of the first NMOS transistor and a gate to which the second control signal is applied.

In example embodiments, the clamping unit may be connected between the data line and a supply voltage, and the clamping unit may turn off in a first operation mode and turn on to clamp the internal signal at the logic high level in a second operation mode.

The power gating unit may include at least one logic block connected in series, where each of the at least one logic block except for a last logic block connected in a last stage among the at least one logic block is connected to a ground voltage, a first power switch connected between each of the at least one logic block and the supply voltage, where the first power switch is closed in the first operation mode and is opened in the second operation mode in response to a first power control signal, and a second power switch connected between the last logic block and the ground voltage, where the second power switch is closed in the first operation mode and is opened in the second operation mode in response to a second power control signal.

The power gating unit may include at least one logic block connected in series, where each of the at least one logic block is connected to the supply voltage, and a power switch connected between each of the at least one logic block and a ground voltage, where the power switch is closed in the first operation mode and is opened in the second operation mode in response to a power control signal.

The clamping unit may include a first clamp switch connected to the data line, where the first clamp switch is closed or opened in response to a first control signal, and a second clamp switch connected between the first clamp switch and the supply voltage, where the second clamp switch is closed or opened in response to a second control signal.

The first clamp switch and the second clamp switch may close at different times separated by an interval of a first reference period and open at different times separated by an interval of a second reference period in the second operation mode.

The first clamp switch may include a first PMOS transistor having a source, a drain connected to the data line and a gate to which the first control signal is applied, and the second clamp switch may include a second PMOS transistor having a source connected to the supply voltage, a drain connected to the source of the first PMOS transistor and a gate to which the second control signal is applied.

In example embodiments, the clamping unit may include a first clamping unit connected between the data line and a ground voltage and a second clamping unit connected between the data line and a supply voltage, where the first clamping unit and the second clamping unit are turned off in a first operation mode, and one of the first clamping unit and the second clamping unit is turned on to clamp the internal signal at the logic low level or at the logic high level in a second operation mode.

The power gating unit may include at least one logic block connected in series, where each of the at least one logic block except for a last logic block connected in a last stage among the at least one logic block is connected to the ground voltage, a first power switch connected between each of the at least one logic block and the supply voltage, where the first power switch is closed in the first operation mode and is opened in the second operation mode in response to a first power control signal, and a second power switch connected between the last logic block and the ground voltage, where the second power switch is closed in the first operation mode and is opened in the second operation mode in response to a second power control signal.

The power gating unit may include at least one logic block connected in series, where each of the at least one logic block except for a last logic block connected in a last stage among the at least one logic block is connected to the supply voltage, a first power switch connected between each of the at least one logic block and the ground voltage, where the first power switch is closed in the first operation mode and is opened in the second operation mode in response to a first power control signal, and a second power switch connected between the last logic block and the supply voltage, where the second power switch is closed in the first operation mode and is opened in the second operation mode in response to a second power control signal.

The first clamping unit may include a first clamp switch connected to the data line, where the first clamp switch is closed or opened in response to a first control signal, and a second clamp switch connected between the first clamp switch and the ground voltage, where the second clamp switch is closed or opened in response to a second control signal. The second clamping unit may include a third clamp switch connected to the data line, where the third clamp switch is closed or opened in response to a third control signal, and a fourth clamp switch connected between the third clamp switch and the supply voltage, where the fourth clamp switch is closed or opened in response to a fourth control signal.

The first clamp switch and the second clamp switch may close at different times separated by an interval of a first reference period and open at different times separated by an interval of a second reference period in the second operation mode while the fourth clamp switch is kept opened, or the third clamp switch and the fourth clamp switch may close at different times separated by an interval of a third reference period and open at different times separated by an interval of a fourth reference period in the second operation mode while the second clamp switch is kept opened.

The first clamp switch may include a first NMOS transistor having a source, a drain connected to the data line and a gate to which the first control signal is applied. The second clamp switch may include a second NMOS transistor having a source connected to the ground voltage, a drain connected to the source of the first NMOS transistor and a gate to which the second control signal is applied. The third clamp switch may include a first PMOS transistor having a source, a drain connected to the data line and a gate to which the third control signal is applied. The fourth clamp switch may include a second PMOS transistor having a source connected to the supply voltage, a drain connected to the source of the first PMOS transistor and a gate to which the fourth control signal is applied.

According to example embodiments, a system-on-chip includes a plurality of semiconductor devices and a controller. The plurality of semiconductor devices are connected in series, where each of the plurality of semiconductor devices generates an output signal in response to a control signal. The controller provides the control signal to the plurality of semiconductor devices. Each of the plurality of semiconductor devices includes a power gating unit, a combinational logic unit and a clamping unit. The power gating unit is turned on to output an internal signal at an output electrode based on an input signal or turned off according to operation modes determined by the control signal. The combinational logic unit includes an input electrode directly connected to the output electrode of the power gating unit through a data line, and the combinational logic unit outputs the output signal based on the internal signal received through the data line. The clamping unit is turned on to clamp the internal signal at a logic high level or at a logic low level or turned off according to the operation modes.

According to example embodiments, a semiconductor device includes a power gating unit configured to output an internal signal based an input signal and an operation mode, a clamping unit configured to clamp the internal signal based on the operation mode, and a combinational logic configured to directly receive the internal signal and generate an output signal based on the internal signal.

The combinational logic is configured to directly receive the internal signal during a first operation mode.

The clamping unit is configured to clamp the internal signal during a second operation mode and the combinational logic is configured to receive the clamped internal signal and generate the output signal based on the clamped internal signal.

The power gating unit and the combinational logic are operatively connected by a data line, and the clamping unit includes a first clamp switch connected to the data line and a second clamp switch connected between the first clamp switch and a ground voltage.

The first clamp switch and the second clamp switch are configured to close at different times.

BRIEF DESCRIPTION OF THE DRAWINGS

Illustrative, non-limiting example embodiments will be more clearly understood from the following detailed description in conjunction with the accompanying drawings.

DETAILED DESCRIPTION OF EXAMPLE EMBODIMENTS

Figure 1:
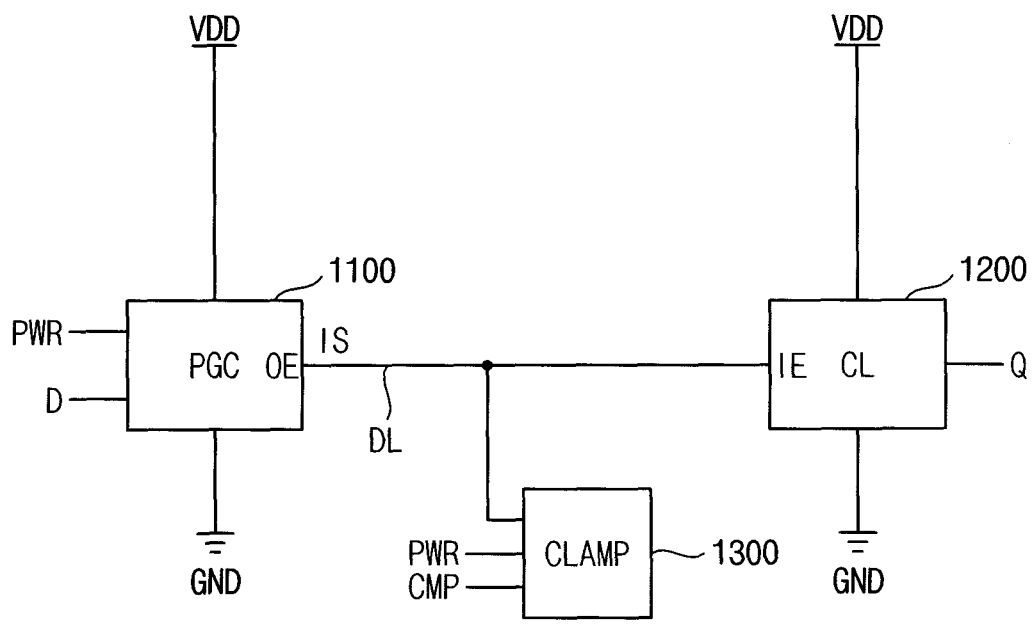
FIG. 1 is a block diagram illustrating a semiconductor device according to example embodiments.

Various example embodiments will be described more fully with reference to the accompanying drawings, in which some example embodiments are shown. Inventive concepts may, however, be embodied in many different forms and should not be construed as limited to example embodiments set forth herein. Rather, example embodiments are provided so that this disclosure will be thorough and complete, and will fully convey the scope of inventive concepts to those skilled in the art. Like reference numerals refer to like elements throughout this application.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of inventive concepts. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments and is not intended to be limiting of inventive concepts. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a semiconductor device according to example embodiments.

Referring to FIG. 1, a semiconductor device 1000 includes a power gating unit PGC 1100, a combinational logic unit CL 1200 and a clamping unit CLAMP 1300.

The power gating unit 1100 is connected between a supply voltage VDD and a ground voltage GND. The power gating unit 1100 receives an input signal D and at least one power control signal PWR. The power gating unit 1100 is turned on to output an internal signal IS at an output electrode OE based the input signal D or turned off according to operation modes. The operation modes may be determined by the at least one power control signal PWR. For example, the operation modes may be determined as a first operation mode or a second operation mode based on a logic level of the at least one power control signal PWR. The power gating unit 1100 may be turned on in the first operation mode and turned off in the second operation mode. The power gating unit 1100 may be provided with a power from the supply voltage VDD to generate the internal signal IS by performing a logical operation on the input signal D in the first operation mode. The power gating unit 1100 may not be provided with a power from the supply voltage VDD and a logic level of the output electrode OE may be floated (that is, the logic level of the output electrode OE may not be determined as either a logic low level or a logic high level) in the second operation mode. The first operation mode may be a normal mode in which the power gating unit 1100 performs a normal operation, and the second operation mode may be a standby mode in which the power gating unit 1100 stops operating for reducing power consumption.

In some example embodiments, the power gating unit 1100 may have a header structure in which a connection between the power gating unit 1100 and the supply voltage VDD is disconnected in the second operation mode. In other example embodiments, the power gating unit 1100 may have a footer structure in which a connection between the power gating unit 1100 and the ground voltage GND is disconnected in the second operation mode. In still other example embodiments, the power gating unit 1100 may have a header and footer structure in which both a connection between the power gating unit 1100 and the supply voltage VDD and a connection between the power gating unit 1100 and the ground voltage GND are disconnected in the second operation mode.

The power gating unit 1100 may include a standard cell. For example, the power gating unit 1100 may include a standard cell having the header structure, a standard cell having the footer structure or a standard cell having the header and footer structure.

The combinational logic unit 1200 is connected between the supply voltage VDD and the ground voltage GND. The combinational logic unit 1200 includes an input electrode IE directly connected to the output electrode OE of the power gating unit 1100 through a data line DL. The combinational logic unit 1200 generates an output signal Q based on the internal signal IS received through the data line DL.

In some example embodiments, the combinational logic unit 1200 may be turned on or turned off according to the operation modes like the power gating unit 1100. In other example embodiments, the combinational logic unit 1200 may be kept turned on regardless of the operation modes.

The clamping unit 1300 is connected to the data line DL. The clamping unit 1300 receives the at least one power control signal PWR and at least one clamp control signal CMP. The clamping unit 1300 is turned on to clamp the internal signal IS on the data line DL at the logic high level or at the logic low level or turned off according to the operation modes. For example, the clamping unit 1300 may prevent a signal that is floated from being provided to the input electrode IE of the combinational logic unit 1200 through the data line DL by clamping the data line DL at the logic high level or at the logic low level when the output electrode OE of the power gating unit 1100 is floated in the second operation mode. A detailed description of a structure and an operation of the clamping unit 1300 will be described later.

As will be described later, the at least one power control signal PWR may include only a first power control signal PWR1 or include a first power control signal PWR1 and a second power control signal PWR2. The second power control signal PWR2 may be an inverted signal of the first power control signal PWR1.

Conventionally, a semiconductor device includes an isolation cell between a power gating unit and a combinational logic unit in order to prevent a signal that is floated from being provided to the combinational logic unit even if the power gating unit is turned off. Therefore, an operation speed of the semiconductor device having the isolation cell maybe slowed since a signal is delayed by an insertion of the isolation cell.

In the semiconductor device 1000 according to example embodiments, the output electrode OE of the power gating unit 1100 and the input electrode IE of the combinational logic unit 1200 are directly connected through the data line DL without an isolation cell, and the clamping unit 1300 connected to the data line DL clamps the data line DL at the logic high level or at the logic low level in the second operation mode. Therefore, the semiconductor device 1000 may clamp the output electrode OE of the power gating unit 1100 without degrading an operation speed of the semiconductor device 1000.

Figure 2:
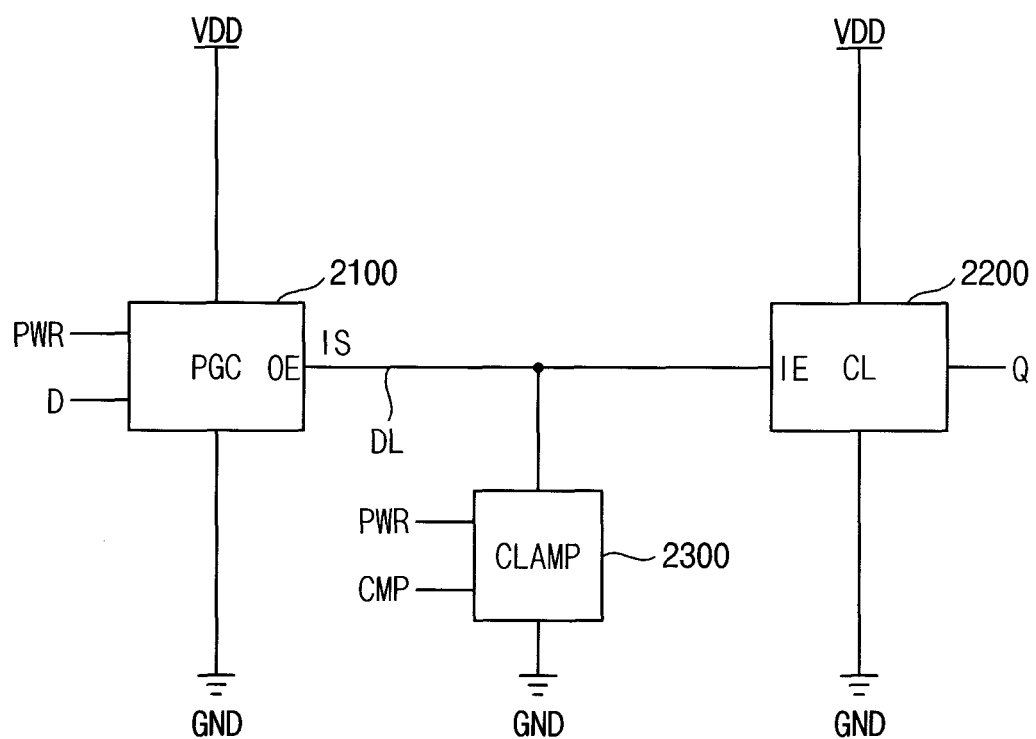
FIG. 2 is a block diagram illustrating an example of the semiconductor device of FIG. 1.

FIG. 2 is a block diagram illustrating an example of a semiconductor device of FIG. 1.

Referring to FIG. 2, a semiconductor device 2000 includes a power gating unit PGC 2100, a combinational logic unit CL 2200 and a clamping unit CLAMP 2300.

The power gating unit 2100 and the combinational logic unit 2200 included in the semiconductor device 2000 of FIG. 2 may have the same structure as the power gating unit 1100 and the combinational logic unit 1200 included in the semiconductor device 1000 of FIG. 1. Thus, a detailed description of the power gating unit 2100 and the combinational logic unit 2200 will be omitted.

The clamping unit 2300 may be connected between the data line DL and the ground voltage GND. The clamping unit 2300 may be turned off in the first operation mode and be turned on to clamp the internal signal IS on the data line DL at the logic low level in the second operation mode. For example, the clamping unit 2300 may not influence a logic level of the data line DL by disconnecting the data line DL from the ground voltage GND in the first operation mode, and clamp internal signal IS on the data line DL at the logic low level by connecting the data line DL to the ground voltage GND in the second operation mode.

Figure 3:
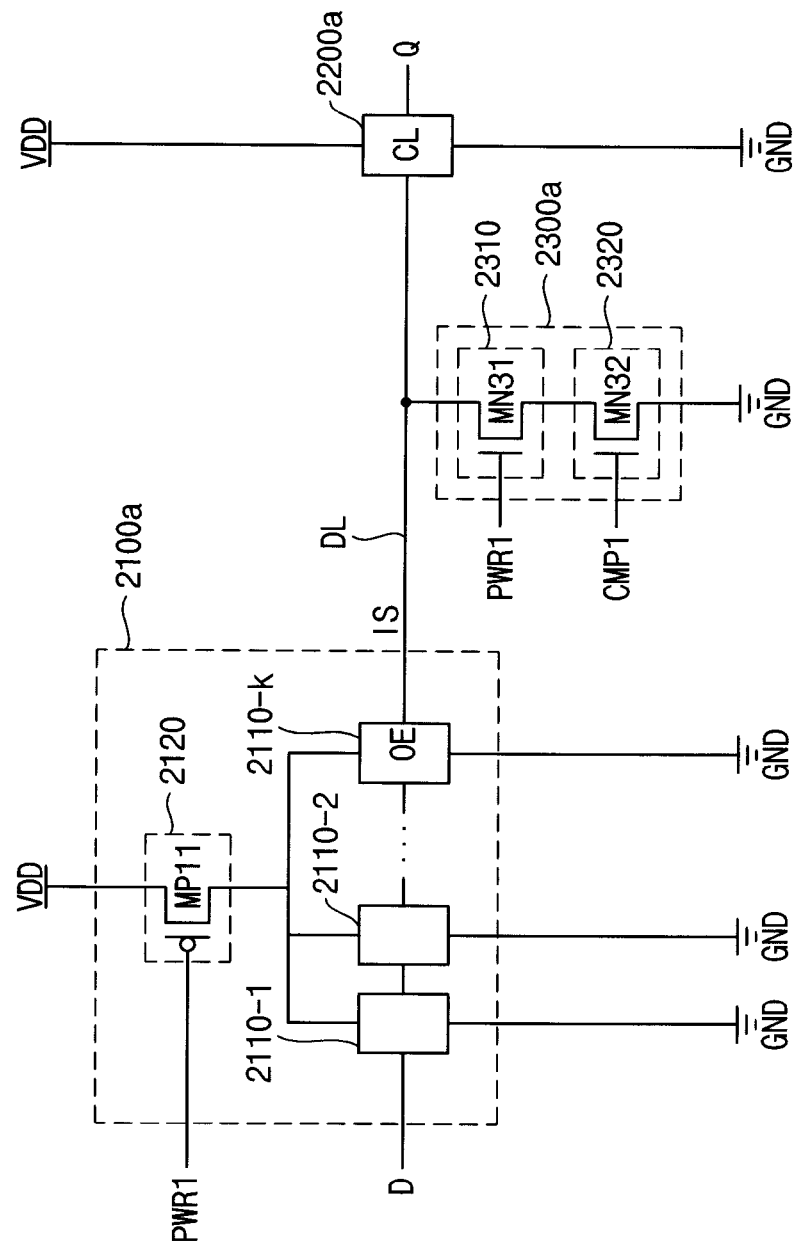
FIGS. 3, 4 and 5 are block diagrams illustrating examples of a semiconductor device of FIG. 2.

FIG. 3 is a block diagram illustrating an example of a semiconductor device of FIG. 2.

Referring to FIG. 3, a semiconductor device 2000a includes a power gating unit 2100a, a combinational logic unit 2200a and a clamping unit 2300a.

The power gating unit 2100a may include at least one logic block 2110-1, 2110-2, . . . , 2110-k (k is a positive integer) connected in series and a first power switch 2120.

Each of the at least one logic block 2110-1, 2110-2, . . . , 2110-k may be connected to the ground voltage GND.

A first logic block 2110-1 connected in a first stage among the at least one logic block 2110-1, 2110-2, . . . , 2110-k may receive the input signal D, perform a logical operation on the input signal D, and generate an output signal. Other logic blocks 2110-2, . . . , 2110-k may receive an output signal of a logic block connected in a previous stage, perform a logical operation on the received output signal, and generate an output signal. An output electrode of a last logic block 2110-k connected in a last stage among the at least one logic block 2110-1, 2110-2, . . . , 2110-k may be the output electrode OE of the power gating unit 2100a. The last logic block 2110-k may provide the internal signal IS to the combinational logic block 2200a at the output electrode OE. Each of the at least one logic block 2110-1, 2110-2, . . . , 2110-k may be any logic block that performs a predetermined logical operation.

The first power switch 2120 may be connected between each of the at least one logic block 2110-1, 2110-2, . . . , 2110-k and the supply voltage VDD. The first power switch 2120 may be closed in the first operation mode and be opened in the second operation mode in response to the first power control signal PWR1. For example, the first power switch 2120 may be closed in the first operation mode to connect the supply voltage VDD to each of the at least one logic block 2110-1, 2110-2, . . . , 2110-k so that the at least one logic block 2110-1, 2110-2, . . . , 2110-k performs a normal operation to generate the internal signal IS, and be opened in the second operation mode to separate the supply voltage VDD from each of the at least one logic block 2110-1, 2110-2, . . . , 2110-k so that the output electrode OE of the power gating unit 2100a is floated.

In some example embodiments, the first power switch 2120 may include a p-type metal oxide semiconductor (PMOS) transistor MP11 having a source connected to the supply voltage VDD, a drain connected to each of the at least one logic block 2110-1, 2110-2, . . . , 2110-k, and a gate to which the first power control signal PWR1 is applied. In this case, the power gating unit 2100a may operate in the first operation mode when the first power control signal PWR1 is in the logic low level and operate in the second operation mode when the first power control signal PWR1 is in the logic high level. Therefore, the PMOS transistor MP11 may be turned on in the first operation mode and be turned off in the second operation mode.

The power gating unit 2100a may be embodied by a standard cell having the header structure.

The combinational logic unit 2200a may operate in the same way as the combinational logic unit 1200 of FIG. 1. Thus, a detailed description of the combinational logic unit 2200a will be omitted.

The clamping unit 2300a may include a first clamp switch 2310 and a second clamp switch 2320. The first clamp switch 2310 may be connected between the data line DL and the second clamp switch 2320, and the second clamp switch 2320 may be connected between the first clamp switch 2310 and the ground voltage GND. The first clamp switch 2310 may be closed or opened in response to the first power control signal PWR1, and the second clamp switch 2320 may be closed or opened in response to a first clamp control signal CMP1.

In the first operation mode, both the first clamp switch 2310 and the second clamp switch 2320 may be opened so that the clamping unit 2300a does not influence the logic level of the data line DL by disconnecting the data line DL from the ground voltage GND. In the second operation mode, both the first clamp switch 2310 and the second clamp switch 2320 may be closed so that the clamping unit 2300a clamps the data line DL at the logic low level by connecting the data line DL to the ground voltage GND.

As will be described later, the first power control signal PWR1 and the first clamp control signal CMP1 may transit consecutively with a time interval in the second operation mode so that the first clamp switch 2310 and the second clamp switch 2320 are closed or opened at different times separated by the time interval in the second operation mode. For example, the first clamp switch 2310 and the second clamp switch 2320 may be closed at different times separated by an interval of a first reference period and be opened at different times separated by an interval of a second reference period in the second operation mode.

The first clamp switch 2310 may include a n-type metal oxide semiconductor (NMOS) transistor MN31 having a source, a drain connected to the data line DL and a gate to which the first power control signal PWR1 is applied. The second clamp switch 2320 may include a NMOS transistor MN32 having a source connected to the ground voltage GND, a drain connected to the source of the NMOS transistor MN31 and a gate to which the first clamp control signal CMP1 is applied.

In some example embodiments, the locations of the first clamp switch 2310 and the second clamp switch 2320 may be changed.

Figure 6:
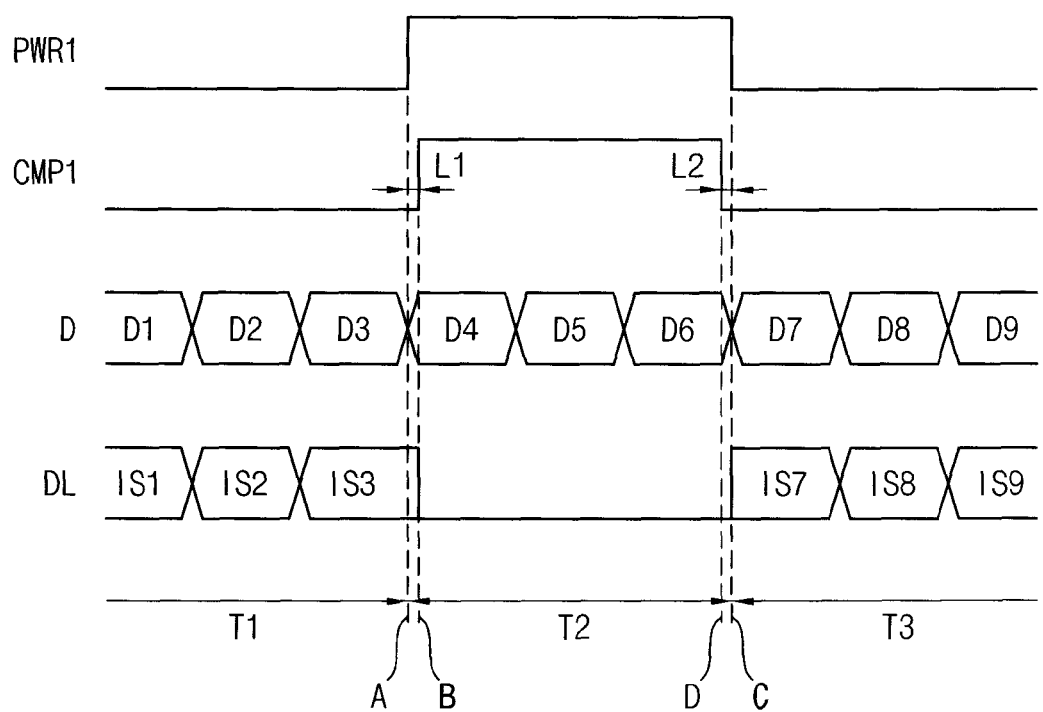
FIG. 6 is a timing diagram for describing an operation of a semiconductor device of FIG. 3 according to an example embodiment.

FIG. 6 is a timing diagram for describing an operation of a semiconductor device of FIG. 3.

Referring to FIG. 6, the semiconductor device 2000a may operate in the first operation mode during a first period T1 and a third period T3, and operate in the second operation mode during a second period T2.

In the first period T1, the first power control signal PWR1 is kept in the logic low level. Therefore, the first power switch 2120, which includes the PMOS transistor MP11, included in the power gating unit 2100a may be closed so that the at least one logic block 2110-1, 2110-2, ..., 2110-k performs a normal operation to generate the internal signal IS in the first period T1.

In the first period T1, both the first power control signal PWR1 and the first clamp control signal CMP1 are kept in the logic low level. Therefore, both the first clamp switch 2310, which includes the NMOS transistor MN31, and the second clamp switch 2320, which includes the NMOS transistor MN32, included in the clamping unit 2300a may be opened so that the clamping unit 2300a does not influence the logic level of the data line DL.

Therefore, in the first period T1, the power gating unit 2100a may output the internal signal IS1, IS2 and IS3 consecutively at the output electrode OE based on the input signal D1, D2 and D3, and, as illustrated in FIG. 6, the data line DL has a logic level corresponding to the internal signal IS1, IS2 and IS3 received from the power gating unit 2100a. The internal signal IS1, IS2 and IS3 may be provided to the combinational logic unit 2200a through the data line DL.

In the second period T2, the semiconductor device 2000a may operate in the second operation mode. The first power control signal PWR1 transits to the logic high level at a time A, which is a start of the second period T2, so that the first power switch 2120, which includes the PMOS transistor MP11, is turned off and the first clamp switch 2310, which includes the NMOS transistor MN31, is turned on.

When the first power control signal PWR1 transits from the logic low level to the logic high level, the first power control signal PWR1 starts to rise from the logic low level and reach the logic high level after a rising transition time. Since the first power control signal PWR1 is applied to both gates of the PMOS transistor MP11 and the NMOS transistor MN31 at the same time, a time that both the PMOS transistor MP11 and the NMOS transistor MN31 are turned on may exist during the rising transition time. If the clamping unit 2300a includes only the first clamp switch 2310, which includes the NMOS transistor MN31, and does not include the second clamp switch 2320, which includes the NMOS transistor MN32, a short current may flow from the supply voltage VDD through the PMOS transistor MP11 and the NMOS transistor MN31 to the ground voltage GND during the rising transition time. Therefore, power consumption of the semiconductor device 2000a may increase.

However, the clamping unit 2300a included in the semiconductor device 2000a according to example embodiments includes the second clamp switch 2320 connected between the first clamp switch 2310 and the ground voltage GND. The first clamp switch 2310 and the second clamp switch 2320 may be closed or opened at different times separated by a time interval. Therefore, the clamping unit 2300a may prevent the short current and power consumption of the semiconductor device 2000a may decrease.

As illustrated in FIG. 6, the first power control signal PWR1 transits to the logic high level at a time A, and then the first clamp control signal CMP1 transits to the logic high level at a time B which is separated by an interval of a first reference period L1 from the time A. The first reference period L1 may be the same as or greater than the rising transition time of the first power control signal PWR1. Therefore, the PMOS transistor MP11 may start to be turned off and the NMOS transistor MN31 may start to be turned on at the time A, and the PMOS transistor MP11 may be turned off completely and the NMOS transistor MN31 may be turned on completely at the time B. The first clamp control signal CMP1 transits to the logic high level at the time B so that the NMOS transistor MN32 is turned on. Therefore, there is no period that all of the PMOS transistor MP11, the NMOS transistor MN31 and the NMOS transistor MN32 are turned on at the same time, and the clamping unit 2300a may prevent the short current and power consumption of the semiconductor device 2000a may decrease.

If the PMOS transistor MP11 is started to be turned off at the time A, the logic level of the output electrode OE may start to be changed from a previous logic state IS3 to a floating state. However, the first reference period L1 is much shorter than a time required for the logic level of the output electrode OE to be completely changed from the previous logic state IS3 to a floating state. Therefore, as illustrated in FIG. 6, the logic level of the data line DL may be kept in the previous logic state IS3 during the first reference period L1.

After the time B, the PMOS transistor MP11 may be completely turned off and the output electrode OE of the power gating unit 2100a may be floated. However, both the NMOS transistor MN31 and the NMOS transistor MN32 may be turned on to connect the data line DL to the ground voltage GND after the time B since both the first power control signal PWR1 and the first clamp control signal CMP1 are in the logic high level after the time B. Therefore, as illustrated in FIG. 6, the logic level of the data line DL may be clamped at the logic low level during the second period T2 even if the output electrode OE of the power gating unit 2100a is floated. A signal having the logic low level may be provided to the combinational logic unit 2200a through the data line DL during the second period T2.

In the third period T3, the semiconductor device 2000a may operate in the first operation mode. The first power control signal PWR1 transits to the logic low level at a time C, which is a start of the third period T3, so that the first power switch 2120, which includes the PMOS transistor MP11, is turned on and the first clamp switch 2310, which includes the NMOS transistor MN31, is turned off.

When the first power control signal PWR1 transits from the logic high level to the logic low level, the first power control signal PWR1 starts to fall from the logic high level and reaches the logic low level after a falling transition time. Since the first power control signal PWR1 is applied to both gates of the PMOS transistor MP11 and the NMOS transistor MN31 at the same time, a time that both the PMOS transistor MP11 and the NMOS transistor MN31 are turned on may exist during the falling transition time. If the clamping unit 2300a includes only the first clamp switch 2310, which includes the NMOS transistor MN31, and does not include the second clamp switch 2320, which includes the NMOS transistor MN32, a short current may flow from the supply voltage VDD through the PMOS transistor MP11 and the NMOS transistor MN31 to the ground voltage GND during the falling transition time. Therefore, power consumption of the semiconductor device 2000a may increase.

However, the clamping unit 2300a included in the semiconductor device 2000a according to example embodiments includes the second clamp switch 2320 connected between the first clamp switch 2310 and the ground voltage GND. The first clamp switch 2310 and the second clamp switch 2320 may be closed or opened at different times separated by a time interval. Therefore, the clamping unit 2300a may prevent the short current and power consumption of the semiconductor device 2000a may decrease.

As illustrated in FIG. 6, the first clamp control signal CMP1 transits to the logic low level at a time D before the first power control signal PWR1 transits to the logic low level at a time C which is separated by an interval of a second reference period L2 from the time D. The second reference period L2 may be the same as or greater than a falling transition time of the first clamp control signal CMP1. Therefore, the NMOS transistor MN32 may start to be turned off at the time D, and the NMOS transistor MN32 may be turned off completely at the time C. The first power control signal PWR1 transits to the logic low level at the time C so that the PMOS transistor MP11 is turned on and the NMOS transistor MN31 is turned off. Therefore, there is no period that all of the PMOS transistor MP11, the NMOS transistor MN31 and the NMOS transistor MN32 are turned on at the same time, and the clamping unit 2300a may prevent the short current and power consumption of the semiconductor device 2000a may decrease.

If the NMOS transistor MN32 is start to be turned off at the time C, the logic level of the data line DL may start to be changed from the logic low level to a floating state. However, the second reference period L2 is much shorter than a time required for the logic level of the data line DL to be completely changed from the logic low level to a floating state. Therefore, as illustrated in FIG. 6, the logic level of the data line DL may be kept in the logic low level during the second reference period L2.

After the time C, the first power control signal PWR1 is in the logic low level so that the PMOS transistor MP11 is turned on and the at least one logic block 2110-1, 2110-2, . . . , 2110-k performs a normal operation to generate the internal signal IS. In addition, both the first power control signal PWR1 and the first clamp control signal CMP1 are in the logic low level after the time C so that both the NMOS transistor MN31 and the NMOS transistor MN32 are turned off and the clamping unit 2300a does not influence the logic level of the data line DL. Therefore, in the third period T3, the power gating unit 2100a may output the internal signal IS7, IS8 and IS9 consecutively at the output electrode OE based on the input signal D7, D8 and D9, and, as illustrated in FIG. 6, the data line DL have a logic level corresponding to the internal signal IS7, IS8 and IS9 received from the power gating unit 2100a. The internal signal IS7, IS8 and IS9 may be provided to the combinational logic unit 2200a through the data line DL.

Figure 4:
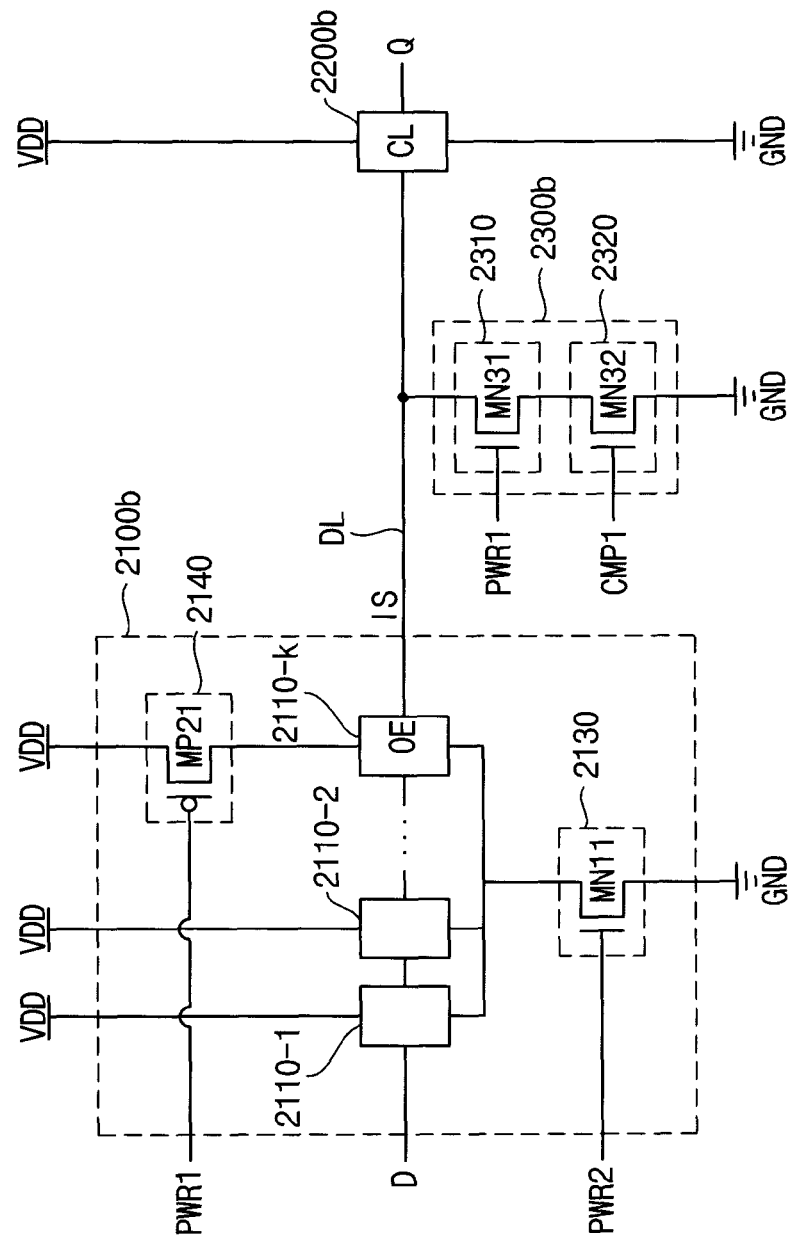

FIG. 4 is a block diagram illustrating another example of a semiconductor device of FIG. 2.

Referring to FIG. 4, a semiconductor device 2000b includes a power gating unit 2100b, a combinational logic unit 2200b and a clamping unit 2300b.

The combinational logic unit 2200b and the clamping unit 2300b included in the semiconductor device 2000b of FIG. 4 may have the same structure as the combinational logic unit 2200a and the clamping unit 2300a included in the semiconductor device 2000a of FIG. 3. Thus, a detailed description of the combinational logic unit 2200b and the clamping unit 2300b will be omitted.

The power gating unit 2100b may include at least one logic block 2110-1, 2110-2, . . . , 2110-k connected in series, a second power switch 2130 and a third power switch 2140.

Each of the at least one logic block 2110-1, 2110-2, . . . , 2110-k except for a last logic block 2110-k connected in a last stage among the at least one logic block 2110-1, 2110-2, . . . , 2110-k may be directly connected to the supply voltage VDD.

The at least one logic block 2110-1, 2110-2, . . . , 2110-k included in the power gating unit 2100b may have the same structure as the at least one logic block 2110-1, 2110-2, . . . , 2110-k included in the power gating unit 2100a. Thus, a detailed description of the at least one logic block 2110-1, 2110-2, . . . , 2110-k will be omitted.

The second power switch 2130 may be connected between each of the at least one logic block 2110-1, 2110-2, . . . , 2110-k and the ground voltage GND. The second power switch 2130 may be closed in the first operation mode and be opened in the second operation mode in response to the second power control signal PWR2. For example, the second power switch 2130 may be closed in the first operation mode to connect the ground voltage GND to each of the at least one logic block 2110-1, 2110-2, . . . , 2110-k so that the at least one logic block 2110-1, 2110-2, . . . , 2110-k performs a normal operation to generate the internal signal IS, and be opened in the second operation mode to separate the ground voltage GND from each of the at least one logic block 2110-1, 2110-2, . . . , 2110-k so that the output electrode OE of the power gating unit 2100b is floated.

In some example embodiments, the second power switch 2130 may include a NMOS transistor MN11 having a source connected to the ground voltage GND, a drain connected to each of the at least one logic block 2110-1, 2110-2, . . . , 2110-k, and a gate to which the second power control signal PWR2 is applied. In this case, the power gating unit 2100b may operate in the first operation mode when the second power control signal PWR2 is in the logic high level and operate in the second operation mode when the second power control signal PWR2 is in the logic low level. Therefore, the NMOS transistor MN11 may be turned on in the first operation mode and be turned off in the second operation mode.

The third power switch 2140 may be connected between the last logic block 2110-k and the supply voltage VDD. The third power switch 2140 may be closed in the first operation mode and be opened in the second operation mode in response to the first power control signal PWR1.

In some example embodiments, the third power switch 2140 may include a PMOS transistor MP21 having a source connected to the supply voltage VDD, a drain connected to the last logic block 2110-k, and a gate to which the first power control signal PWR1 is applied. As described above, the second power control signal PWR2 may be an inverted signal of the first power control signal PWR1. Therefore, the first power control signal PWR1 may be in the logic low level in the first operation mode so that the PMOS transistor MP21 is turned on, and the first power control signal PWR1 may be in the logic high level in the second operation mode so that the PMOS transistor MP21 is turned off.

In the power gating unit 2100b, elements except for the third power switch 2140 may be embodied by a standard cell having the footer structure. That is, the power gating unit 2100b may include the third power switch 2140 and the standard cell having the footer structure. If the power gating unit 2100b includes only the standard cell having the footer structure and does not include the third power switch 2140, the data line DL may not be clamped at the logic low level in the second operation mode even if both the first clamp switch 2310 and the second clamp switch 2320 included in the clamping unit 2300b are closed because a path from the supply voltage VDD to the ground voltage GND through the last logic block 2110-k and the clamping unit 2300b is established in the second operation mode.

However, as illustrated in FIG. 4, the power gating unit 2100b included in the semiconductor device 2000b may include the third power switch 2140. As described above, the third power switch 2140 may be opened in the second operation mode to disconnect the last logic block 2110-k from the supply voltage VDD. Therefore, the clamping unit 2300b may clamp the internal signal IS of the data line DL at the logic low level in the second operation mode.

Generally, a size of the NMOS transistor MN11 included in the standard cell having the footer structure is relatively large since the NMOS transistor MN11 provides currents to all of the at least one logic block 2110-1, 2110-2, . . . , 2110-k. However, a size of the PMOS transistor MP21 may be relatively small since the PMOS transistor MP21 provides a current to only the last logic block 2110-k. Therefore, the power gating unit 2100b may be embodied in a small size although the power gating unit 2100b includes the third power switch 2140 in addition to the standard cell having the footer structure.

Figure 7:
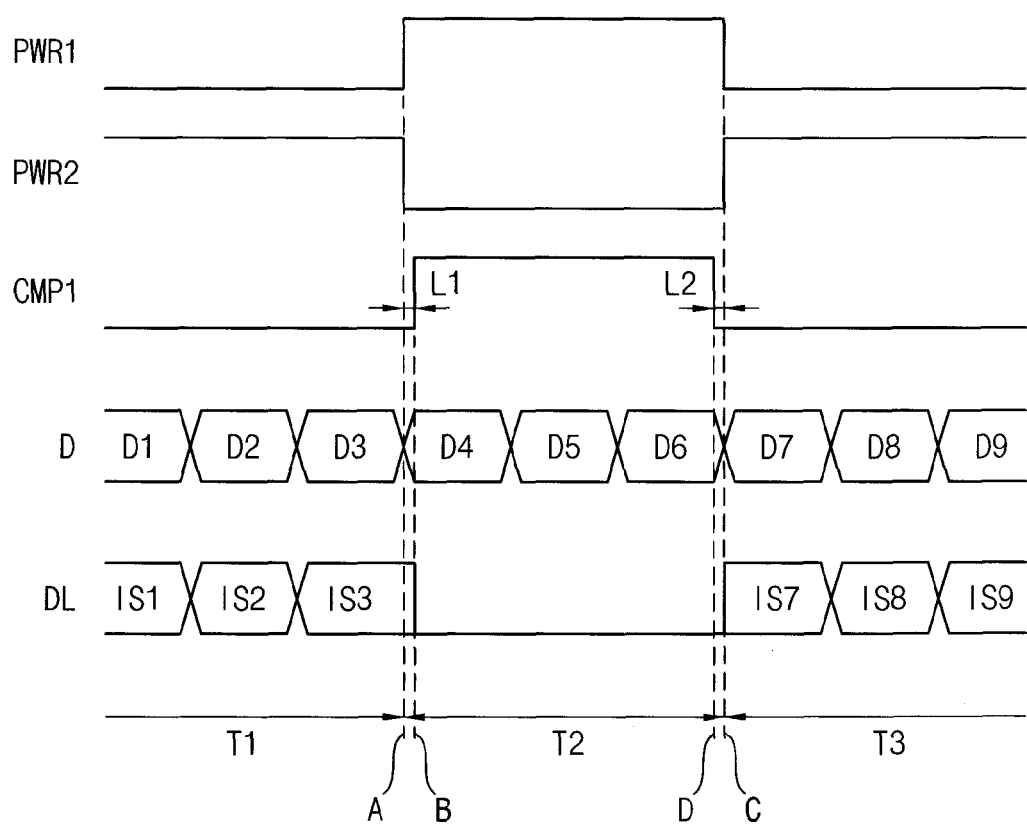
FIG. 7 is a timing diagram for describing an operation of semiconductor devices of FIGS. 4 and 5 according to an example embodiment.

FIG. 7 is a timing diagram for describing an operation of a semiconductor device of FIG. 4.

The timing diagram of FIG. 7 is the same as the timing diagram of FIG. 6 except that the timing diagram of FIG. 7 further includes a waveform of the second power control signal PWR2.

Referring to FIG. 7, the semiconductor device 2000b may operate in the first operation mode during the first period T1 and the third period T3, and operate in the second operation mode during the second period T2.

In the first period T1 and the third period T3, the first power control signal PWR1 is kept in the logic low level and the second power control signal PWR2 is kept in the logic high level. Therefore, both the second power switch 2130, which includes the NMOS transistor MN11, and the third power switch 2140, which includes the PMOS transistor MP21, included in the power gating unit 2100b may be closed so that the at least one logic block 2110-1, 2110-2, . . . , 2110-k performs a normal operation to generate the internal signal IS. In the first period T1 and the third period T3, both the first power control signal PWR1 and the first clamp control signal CMP1 are kept in the logic low level. Therefore, both the first clamp switch 2310, which includes the NMOS transistor MN31, and the second clamp switch 2320, which includes the NMOS transistor MN32, included in the clamping unit 2300b may be opened so that the clamping unit 2300b does not influence the logic level of the data line DL.

In the second period T2, the first power control signal PWR1 is kept in the logic high level and the second power control signal PWR2 is kept in the logic low level. Therefore, both the second power switch 2130, which includes the NMOS transistor MN11, and the third power switch 2140, which includes the PMOS transistor MP21, included in the power gating unit 2100b may be opened so that the output electrode OE of the power gating unit 2100b is floated. However, in the second period T2, both the first power control signal PWR1 and the first clamp control signal CMP1 are in the logic high level. Therefore, both the first clamp switch 2310, which includes the NMOS transistor MN31, and the second clamp switch 2320, which includes the NMOS transistor MN32, included in the clamping unit 2300b may be closed so that the logic level of the data line DL may be clamped at the logic low level during the second period T2 even if the output electrode OE of the power gating unit 2100b is floated.

The clamping unit 2300b included in the semiconductor device 2000b of FIG. 4 may have the same structure as the clamping unit 2300a included in the semiconductor device 2000a of FIG. 3, and an operation of the clamping unit 2300a is described with reference to FIGS. 3 and 6. Thus, a detailed description of an operation of the clamping unit 2300b will be omitted.

Figure 5:
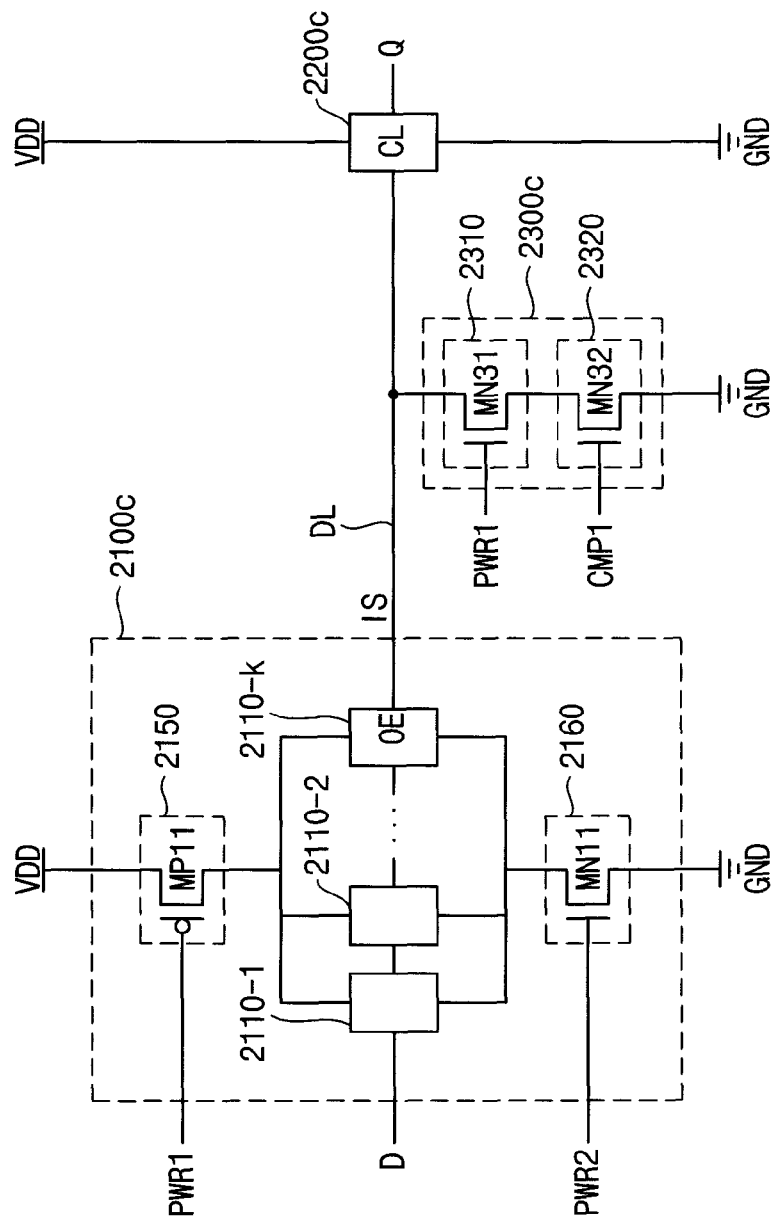

FIG. 5 is a block diagram illustrating still another example of a semiconductor device of FIG. 2.

Referring to FIG. 5, a semiconductor device 2000c includes a power gating unit 2100c, a combinational logic unit 2200c and a clamping unit 2300c.

The combinational logic unit 2200c and the clamping unit 2300c included in the semiconductor device 2000c of FIG. 5 may have the same structure as the combinational logic unit 2200a and the clamping unit 2300a included in the semiconductor device 2000a of FIG. 3. Thus, a detailed description of the combinational logic unit 2200c and the clamping unit 2300c will be omitted.

The power gating unit 2100c may include at least one logic block 2110-1, 2110-2, . . . , 2110-k connected in series, a fourth power switch 2150 and a fifth power switch 2160.

The at least one logic block 2110-1, 2110-2, . . . , 2110-k included in the power gating unit 2100c may have the same structure as the at least one logic block 2110-1, 2110-2, . . . , 2110-k included in the power gating unit 2100a. Thus, a detailed description of the at least one logic block 2110-1, 2110-2, . . . , 2110-k will be omitted.

The fourth power switch 2150 may be connected between each of the at least one logic block 2110-1, 2110-2, . . . , 2110-k and the supply voltage VDD. The fourth power switch 2150 may be closed in the first operation mode and be opened in the second operation mode in response to the first power control signal PWR1. The fifth power switch 2160 may be connected between each of the at least one logic block 2110-1, 2110-2, . . . , 2110-k and the ground voltage GND. The fifth power switch 2160 may be closed in the first operation mode and be opened in the second operation mode in response to the second power control signal PWR2. For example, the fourth power switch 2150 and the fifth power switch 2160 may be closed in the first operation mode to connect the supply voltage VDD and the ground voltage GND to each of the at least one logic block 2110-1, 2110-2, . . . , 2110-k, respectively, so that the at least one logic block 2110-1, 2110-2, . . . , 2110-k performs a normal operation to generate the internal signal IS, and be opened in the second operation mode to separate the supply voltage VDD and the ground voltage GND from each of the at least one logic block 2110-1, 2110-2, . . . , 2110-k, respectively, so that the output electrode OE of the power gating unit 2100c is floated.

In some example embodiments, the fourth power switch 2150 may include the PMOS transistor MP11 having a source connected to the supply voltage VDD, a drain connected to each of the at least one logic block 2110-1, 2110-2, . . . , 2110-k, and a gate to which the first power control signal PWR1 is applied. The fifth power switch 2160 may include the NMOS transistor MN11 having a source connected to the ground voltage GND, a drain connected to each of the at least one logic block 2110-1, 2110-2, . . . , 2110-k, and a gate to which the second power control signal PWR2 is applied. In this case, the power gating unit 2100c may operate in the first operation mode when the first power control signal PWR1 is in the logic low level and the second power control signal PWR2 is in the logic high level, and operate in the second operation mode when the first power control signal PWR1 is in the logic high level and the second power control signal PWR2 is in the logic low level. Therefore, the PMOS transistor MP11 and the NMOS transistor MN11 may be turned on in the first operation mode and be turned off in the second operation mode.

As described above, the second power control signal PWR2 may be an inverted signal of the first power control signal PWR1.

The power gating unit 2100c may be embodied by a standard cell having the header and footer structure.

FIG. 7 is a timing diagram for describing an operation of a semiconductor device of FIG. 5.

The timing diagram of FIG. 7 is the same as the timing diagram of FIG. 6 except that the timing diagram of FIG. 7 further includes a waveform of the second power control signal PWR2.

Referring to FIG. 7, the semiconductor device 2000c may operate in the first operation mode during the first period T1 and the third period T3, and operate in the second operation mode during the second period T2.

In the first period T1 and the third period T3, the first power control signal PWR1 is kept in the logic low level and the second power control signal PWR2 is kept in the logic high level. Therefore, both the fourth power switch 2150, which includes the PMOS transistor MP11, and the fifth power switch 2160, which includes the NMOS transistor MN11, included in the power gating unit 2100c may be closed so that the at least one logic block 2110-1, 2110-2, . . . , 2110-k performs a normal operation to generate the internal signal IS. In the first period T1 and the third period T3, both the first power control signal PWR1 and the first clamp control signal CMP1 are kept in the logic low level. Therefore, both the first clamp switch 2310, which includes the NMOS transistor MN31, and the second clamp switch 2320, which includes the NMOS transistor MN32, included in the clamping unit 2300c may be opened so that the clamping unit 2300c does not influence the logic level of the data line DL.

In the second period T2, the first power control signal PWR1 is kept in the logic high level and the second power control signal PWR2 is kept in the logic low level. Therefore, both the fourth power switch 2150, which includes the PMOS transistor MP11, and the fifth power switch 2160, which includes the NMOS transistor MN11, included in the power gating unit 2100c may be opened so that the output electrode OE of the power gating unit 2100c is floated. However, in the second period T2, both the first power control signal PWR1 and the first clamp control signal CMP1 are in the logic high level. Therefore, both the first clamp switch 2310, which includes the NMOS transistor MN31, and the second clamp switch 2320, which includes the NMOS transistor MN32, included in the clamping unit 2300c may be closed so that the logic level of the data line DL may be clamped at the logic low level during the second period T2 even if the output electrode OE of the power gating unit 2100c is floated.

The clamping unit 2300c included in the semiconductor device 2000c of FIG. 5 may have the same structure as the clamping unit 2300a included in the semiconductor device 2000a of FIG. 3, and an operation of the clamping unit 2300a is described with reference to FIGS. 3 and 6. Thus, a detailed description of an operation of the clamping unit 2300c will be omitted.

Figure 8:
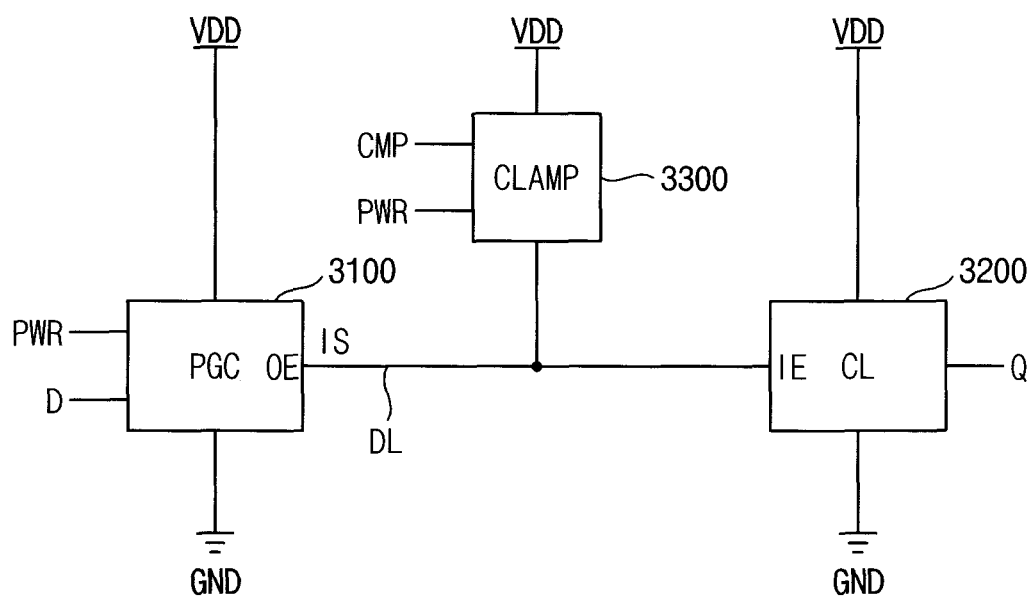
FIG. 8 is a block diagram illustrating another example of a semiconductor device of FIG. 1.

FIG. 8 is a block diagram illustrating another example of a semiconductor device of FIG. 1.

Referring to FIG. 8, a semiconductor device 3000 includes a power gating unit PGC 3100, a combinational logic unit CL 3200 and a clamping unit CLAMP 3300.

The power gating unit 3100 and the combinational logic unit 3200 included in the semiconductor device 3000 of FIG. 8 may have the same structure as the power gating unit 1100 and the combinational logic unit 1200 included in the semiconductor device 1000 of FIG. 1.

The clamping unit 3300 may be connected between the data line DL and the supply voltage VDD. The clamping unit 3300 may be turned off in the first operation mode and be turned on to clamp internal signal IS of the data line DL at the logic high level in the second operation mode. For example, the clamping unit 3300 may not influence a logic level of the data line DL by disconnecting the data line DL from the supply voltage VDD in the first operation mode, and clamp the internal signal IS of the data line DL at the logic high level by connecting the data line DL to the supply voltage VDD in the second operation mode.

Figure 9:
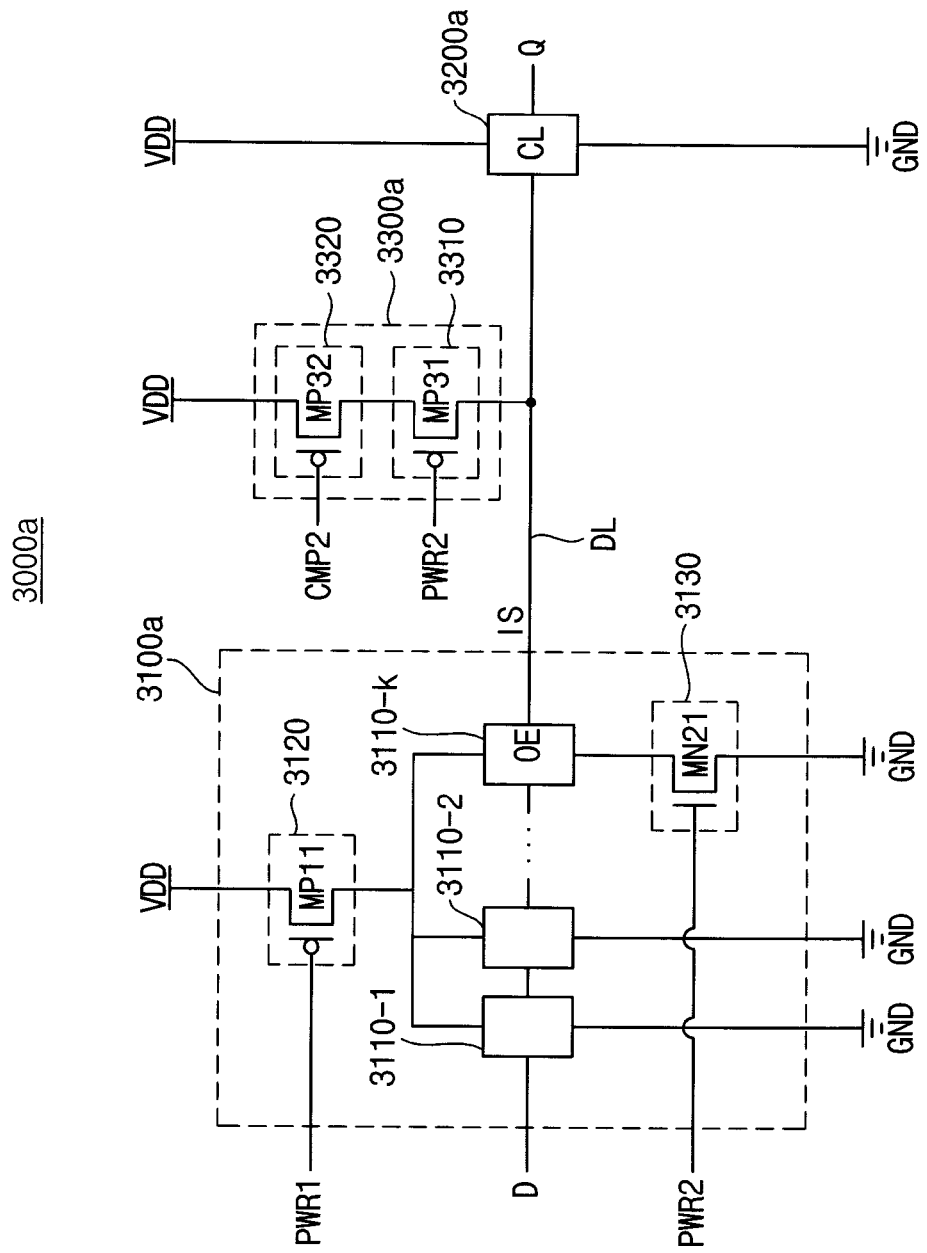
FIGS. 9, 10 and 11 are block diagrams illustrating examples of the semiconductor device of FIG. 8.

FIG. 9 is a block diagram illustrating an example of a semiconductor device of FIG. 8.

Referring to FIG. 9, a semiconductor device 3000a includes a power gating unit 3100a, a combinational logic unit 3200a and a clamping unit 3300a.

The power gating unit 3100a may include at least one logic block 3110-1, 3110-2, . . . , 3110-k connected in series, a sixth power switch 3120 and a seventh power switch 3130.

Each of the at least one logic block 3110-1, 3110-2, . . . , 3110-k except for a last logic block 3110-k connected in a last stage among the at least one logic block 3110-1, 3110-2, . . . , 3110-k may be directly connected to the ground voltage GND.

The at least one logic block 3110-1, 3110-2, . . . , 3110-k included in the power gating unit 3100a of FIG. 9 may have the same structure as the at least one logic block 2110-1, 2110-2, . . . , 2110-k included in the power gating unit 2100a of FIG. 3. Thus, a detailed description of the at least one logic block 3110-1, 3110-2, . . . , 3110-k will be omitted.

The sixth power switch 3120 may be connected between each of the at least one logic block 3110-1, 3110-2, . . . , 3110-k and the supply voltage VDD. The sixth power switch 3120 may be closed in the first operation mode and be opened in the second operation mode in response to the first power control signal PWR1. For example, the sixth power switch 3120 may be closed in the first operation mode to connect the supply voltage VDD to each of the at least one logic block 3110-1, 3110-2, ..., 3110-$k$ so that the at least one logic block 3110-1, 3110-2, ..., 3110-$k$ performs a normal operation to generate the internal signal IS, and be opened in the second operation mode to separate the supply voltage VDD from each of the at least one logic block 3110-1, 3110-2, ..., 3110-$k$ so that the output electrode OE of the power gating unit 3100$a$ is floated.

In some example embodiments, the sixth power switch 3120 may include the PMOS transistor MP11 having a source connected to the supply voltage VDD, a drain connected to each of the at least one logic block 3110-1, 3110-2, ..., 3110-$k$, and a gate to which the first power control signal PWR1 is applied. In this case, the power gating unit 3100$a$ may operate in the first operation mode when the first power control signal PWR1 is in the logic low level and operate in the second operation mode when the first power control signal PWR1 is in the logic high level. Therefore, the PMOS transistor MP11 may be turned on in the first operation mode and be turned off in the second operation mode.

The seventh power switch 3130 may be connected between the last logic block 3110-$k$ and the ground voltage GND. The seventh power switch 3130 may be closed in the first operation mode and be opened in the second operation mode in response to the second power control signal PWR2.

In some example embodiments, the seventh power switch 3130 may include a NMOS transistor MN21 having a source connected to the ground voltage GND, a drain connected to the last logic block 3110-$k$, and a gate to which the second power control signal PWR2 is applied. As described above, the second power control signal PWR2 may be an inverted signal of the first power control signal PWR1. Therefore, the second power control signal PWR2 may be in the logic high level in the first operation mode so that the NMOS transistor MN21 is turned on, and the second power control signal PWR2 may be in the logic low level in the second operation mode so that the NMOS transistor MN21 is turned off.

The combinational logic unit 3200$a$ may operate in the same way as the combinational logic unit 1200 of FIG. 1. Thus, a detailed description of the combinational logic unit 3200$a$ will be omitted.

The clamping unit 3300$a$ may include a third clamp switch 3310 and a fourth clamp switch 3320. The third clamp switch 3310 may be connected between the data line DL and the fourth clamp switch 3320, and the fourth clamp switch 3320 may be connected between the third clamp switch 3310 and the supply voltage VDD. The third clamp switch 3310 may be closed or opened in response to the second power control signal PWR2, and the fourth clamp switch 3320 may be closed or opened in response to a second clamp control signal CMP2.

In the first operation mode, both the third clamp switch 3310 and the fourth clamp switch 3320 may be opened so that the clamping unit 3300$a$ does not influence the logic level of the data line DL by disconnecting the data line DL from the supply voltage VDD. In the second operation mode, both the third clamp switch 3310 and the fourth clamp switch 3320 may be closed so that the clamping unit 3300$a$ clamps the data line DL at the logic high level by connecting the data line DL to the supply voltage VDD.

As will be described later, the second power control signal PWR2 and the second clamp control signal CMP2 may transit consecutively with a time interval in the second operation mode so that the third clamp switch 3310 and the fourth clamp switch 3320 are closed or opened at different times separated by the time interval in the second operation mode. For example, the third clamp switch 3310 and the fourth clamp switch 3320 may be closed at different times separated by an interval of a first reference period and be opened at different times separated by an interval of a second reference period in the second operation mode.

The third clamp switch 3310 may include a PMOS transistor MP31 having a source, a drain connected to the data line DL and a gate to which the second power control signal PWR2 is applied. The fourth clamp switch 3320 may include a PMOS transistor MP32 having a source connected to the supply voltage VDD, a drain connected to the source of the PMOS transistor MP31 and a gate to which the second clamp control signal CMP2 is applied.

In some example embodiments, the locations of the third clamp switch 3310 and the fourth clamp switch 3320 may be changed.

In the power gating unit 3100$a$, elements except for the seventh power switch 3130 may be embodied by a standard cell having the header structure. That is, the power gating unit 3100$a$ may include the seventh power switch 3130 and the standard cell having the header structure. If the power gating unit 3100$a$ includes only the standard cell having the header structure and does not include the seventh power switch 3130, the data line DL may not be clamped at the logic high level in the second operation mode even if both the third clamp switch 3310 and the fourth clamp switch 3320 included in the clamping unit 3300$a$ are closed because a path from the supply voltage VDD to the ground voltage GND through the clamping unit 3300$a$ and the last logic block 3110-$k$ is established in the second operation mode.

However, as illustrated in FIG. 9, the power gating unit 3100$a$ included in the semiconductor device 3000$a$ may include the seventh power switch 3130. As described above, the seventh power switch 3130 may be opened in the second operation mode to disconnect the last logic block 3110-$k$ from the ground voltage GND. Therefore, the clamping unit 3300$a$ may clamp the internal signal IS of the data line DL at the logic high level in the second operation mode.

Generally, a size of the PMOS transistor MP11 included in the standard cell having the header structure is relatively large since the PMOS transistor MP11 provides currents to all of the at least one logic block 3110-1, 3110-2, ..., 3110-$k$. However, a size of the NMOS transistor MN21 may be relatively small since the NMOS transistor MN21 provides a current to only the last logic block 3110-$k$. Therefore, the power gating unit 3100$a$ may be embodied in a small size although the power gating unit 3100$a$ includes the seventh power switch 3130 in addition to the standard cell having the header structure.

Figure 12:
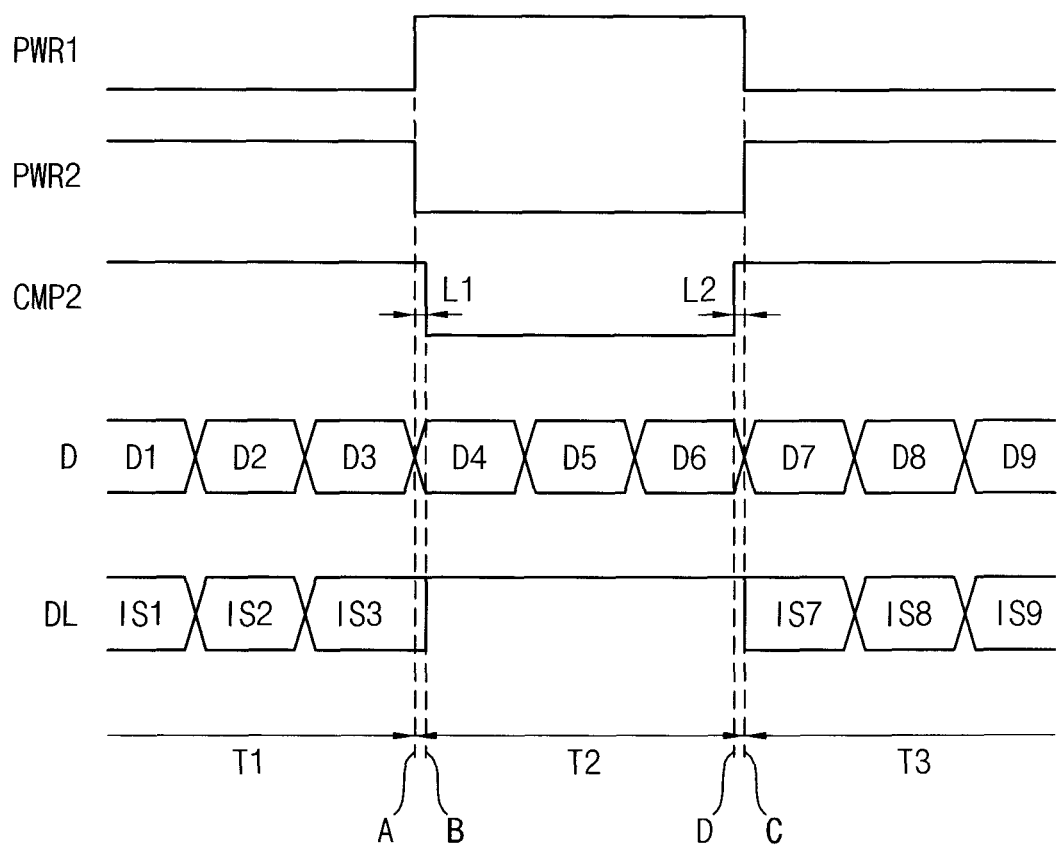
FIG. 12 is a timing diagram for describing an operation of semiconductor devices of FIGS. 9 and 11 according to example embodiments.

FIG. 12 is a timing diagram for describing an operation of the semiconductor device of FIG. 9.

Referring to FIG. 12, the semiconductor device 3000$a$ may operate in the first operation mode during a first period T1 and a third period T3, and operate in the second operation mode during a second period T2.

In the first period T1, the first power control signal PWR1 is kept in the logic low level and the second power control signal PWR2 is kept in the logic high level. Therefore, both the sixth power switch 3120, which includes the PMOS transistor MP11, and the seventh power switch 3130, which includes the NMOS transistor MN21, included in the power gating unit 3100$a$ may be closed so that the at least one logic block 3110-1, 3110-2, ..., 3110-$k$ performs a normal operation to generate the internal signal IS. In the first period T1, both the second power control signal PWR2 and the second clamp control signal CMP2 are kept in the logic high level.

Therefore, both the third clamp switch 3310, which includes the PMOS transistor MP31, and the fourth clamp switch 3320, which includes the PMOS transistor MP32, included in the clamping unit 3300a may be opened so that the clamping unit 3300a does not influence the logic level of the data line DL.

Therefore, in the first period T1, the power gating unit 3100a may output the internal signal IS1, IS2 and IS3 consecutively at the output electrode OE based on the input signal D1, D2 and D3, and, as illustrated in FIG. 12, the data line DL have a logic level corresponding to the internal signal IS1, IS2 and IS3 received from the power gating unit 3100a. The internal signal IS1, IS2 and IS3 may be provided to the combinational logic unit 3200a through the data line DL.

In the second period T2, the semiconductor device 3000a may operate in the second operation mode. The first power control signal PWR1 transits to the logic high level and the second power control signal PWR2 transits to the logic low level at a time A, which is a start of the second period T2, so that the sixth power switch 3120, which includes the PMOS transistor MP11, is turned off, the seventh power switch 3130, which includes the NMOS transistor MN21, is turned off and the third clamp switch 3310, which includes the PMOS transistor MP31, is turned on.

When the second power control signal PWR2 transits from the logic high level to the logic low level, the second power control signal PWR2 starts to fall from the logic high level and reaches the logic low level after a falling transition time. Since the second power control signal PWR2 is applied to both gates of the NMOS transistor MN21 and the PMOS transistor MP31 at the same time, a time that both the NMOS transistor MN21 and the PMOS transistor MP31 are turned on may exist during the falling transition time. If the clamping unit 3300a includes only the third clamp switch 3310, which includes the PMOS transistor MP31, and does not include the fourth clamp switch 3320, which includes the PMOS transistor MP32, a short current may flow from the supply voltage VDD through the PMOS transistor MP31 and the NMOS transistor MN21 to the ground voltage GND during the falling transition time. Therefore, power consumption of the semiconductor device 3000a may increase.

However, the clamping unit 3300a included in the semiconductor device 3000a according to example embodiments includes the fourth clamp switch 3320 connected between the third clamp switch 3310 and the supply voltage VDD. The third clamp switch 3310 and the fourth clamp switch 3320 may be closed or opened at different times separated by a time interval. Therefore, the clamping unit 3300a may prevent the short current and power consumption of the semiconductor device 3000a may decrease.

As illustrated in FIG. 12, the second power control signal PWR2 transits to the logic low level at a time A, and then the second clamp control signal CMP2 transits to the logic low level at a time B which is separated by an interval of a first reference period L1 from the time A. The first reference period L1 may be the same as or greater than the falling transition time of the second power control signal PWR2. Therefore, the NMOS transistor MN21 may start to be turned off and the PMOS transistor MP31 may start to be turned on at the time A, and the NMOS transistor MN21 may be turned off completely and the PMOS transistor MP31 may be turned on completely at the time B. The second clamp control signal CMP2 transits to the logic low level at the time B so that the PMOS transistor MP32 is turned on. Therefore, there is no period that all of the NMOS transistor MN21, the PMOS transistor MP31 and the PMOS transistor MP32 are turned on at the same time, and the clamping unit 3300a may prevent the short current and power consumption of the semiconductor device 3000a may decrease.

If the PMOS transistor MP11 and the NMOS transistor MN21 are started to be turned off at the time A, the logic level of the output electrode OE may start to be changed from a previous logic state IS3 to a floating state. However, the first reference period L1 is much shorter than a time required for the logic level of the output electrode OE to be completely changed from the previous logic state IS3 to a floating state. Therefore, as illustrated in FIG. 12, the logic level of the data line DL may be kept in the previous logic state IS3 during the first reference period L1.

After the time B, the PMOS transistor MP11 and the NMOS transistor MN21 may be completely turned off and the output electrode OE of the power gating unit 3100a may be floated. However, both the PMOS transistor MP31 and the PMOS transistor MP32 may be turned on to connect the data line DL to the supply voltage VDD after the time B since both the second power control signal PWR2 and the second clamp control signal CMP2 are in the logic low level after the time B. Therefore, as illustrated in FIG. 12, the logic level of the data line DL may be clamped at the logic high level during the second period T2 even if the output electrode OE of the power gating unit 3100a is floated. A signal having the logic high level may be provided to the combinational logic unit 3200a through the data line DL during the second period T2.

In the third period T3, the semiconductor device 3000a may operate in the first operation mode. The first power control signal PWR1 transits to the logic low level and the second power control signal PWR2 transits to the logic high level at a time C, which is a start of the third period T3, so that the sixth power switch 3120, which includes the PMOS transistor MP11, is turned on, the seventh power switch 3130, which includes the NMOS transistor MN21, is turned on and the third clamp switch 3310, which includes the PMOS transistor MP31, is turned off.

When the second power control signal PWR2 transits form the logic low level to the logic high level, the second power control signal PWR2 starts to rise from the logic low level and reaches the logic high level after a rising transition time. Since the second power control signal PWR2 is applied to both gates of the NMOS transistor MN21 and the PMOS transistor MP31 at the same time, a time that both the NMOS transistor MN21 and the PMOS transistor MP31 are turned on may exist during the rising transition time. If the clamping unit 3300a includes only the third clamp switch 3310, which includes the PMOS transistor MP31, and does not include the fourth clamp switch 3320, which includes the PMOS transistor MP32, a short current may flow from the supply voltage VDD through the PMOS transistor MP31 and the NMOS transistor MN21 to the ground voltage GND during the rising transition time. Therefore, power consumption of the semiconductor device 3000a may increase.

However, the clamping unit 3300a included in the semiconductor device 3000a according to example embodiments includes the fourth clamp switch 3320 connected between the third clamp switch 3310 and the supply voltage VDD. The third clamp switch 3310 and the fourth clamp switch 3320 may be closed or opened at different times separated by a time interval. Therefore, the clamping unit 3300a may prevent the short current and power consumption of the semiconductor device 3000a may decrease.

As illustrated in FIG. 12, the second clamp control signal CMP2 transits to the logic high level at a time D before the second power control signal PWR2 transits to the logic high level at a time C which is separated by an interval of a second reference period L2 from the time D. The second reference period L2 may be the same as or greater than a rising transition time of the second clamp control signal CMP2. Therefore, the PMOS transistor MP32 may start to be turned off at the time D, and the PMOS transistor MP32 may be turned off completely at the time C. The second power control signal PWR2 transits to the logic high level at the time C so that the NMOS transistor MN21 is turned on and the PMOS transistor MP31 is turned off. Therefore, there is no period that all of the NMOS transistor MN21, the PMOS transistor MP31 and the PMOS transistor MP32 are turned on at the same time, and the clamping unit 3300a may prevent the short current and power consumption of the semiconductor device 3000a may decrease.

If the PMOS transistor MP32 is started to be turned off at the time C, the logic level of the data line DL may start to be changed from the logic high level to a floating state. However, the second reference period L2 is much shorter than a time required for the logic level of the data line DL to be completely changed from the logic high level to a floating state. Therefore, as illustrated in FIG. 12, the logic level of the data line DL may be kept in the logic high level during the second reference period L2.

After the time C, the first power control signal PWR1 is in the logic low level and the second power control signal PWR2 is in the logic high level so that the PMOS transistor MP11 and the NMOS transistor MN21 are turned on and the at least one logic block 3110-1, 3110-2, . . . , 3110-k performs a normal operation to generate the internal signal IS. In addition, both the second power control signal PWR2 and the second clamp control signal CMP2 are in the logic high level after the time C so that both the PMOS transistor MP31 and the PMOS transistor MP32 are turned off and the clamping unit 3300a does not influence the logic level of the data line DL. Therefore, in the third period T3', the power gating unit 3100a may output the internal signal IS7, IS8 and IS9 consecutively at the output electrode OE based on the input signal D7, D8 and D9, and, as illustrated in FIG. 12, the data line DL have a logic level corresponding to the internal signal IS7, IS8 and IS9 received from the power gating unit 3100a. The internal signal IS7, IS8 and IS9 may be provided to the combinational logic unit 3200a through the data line DL.

Figure 10:
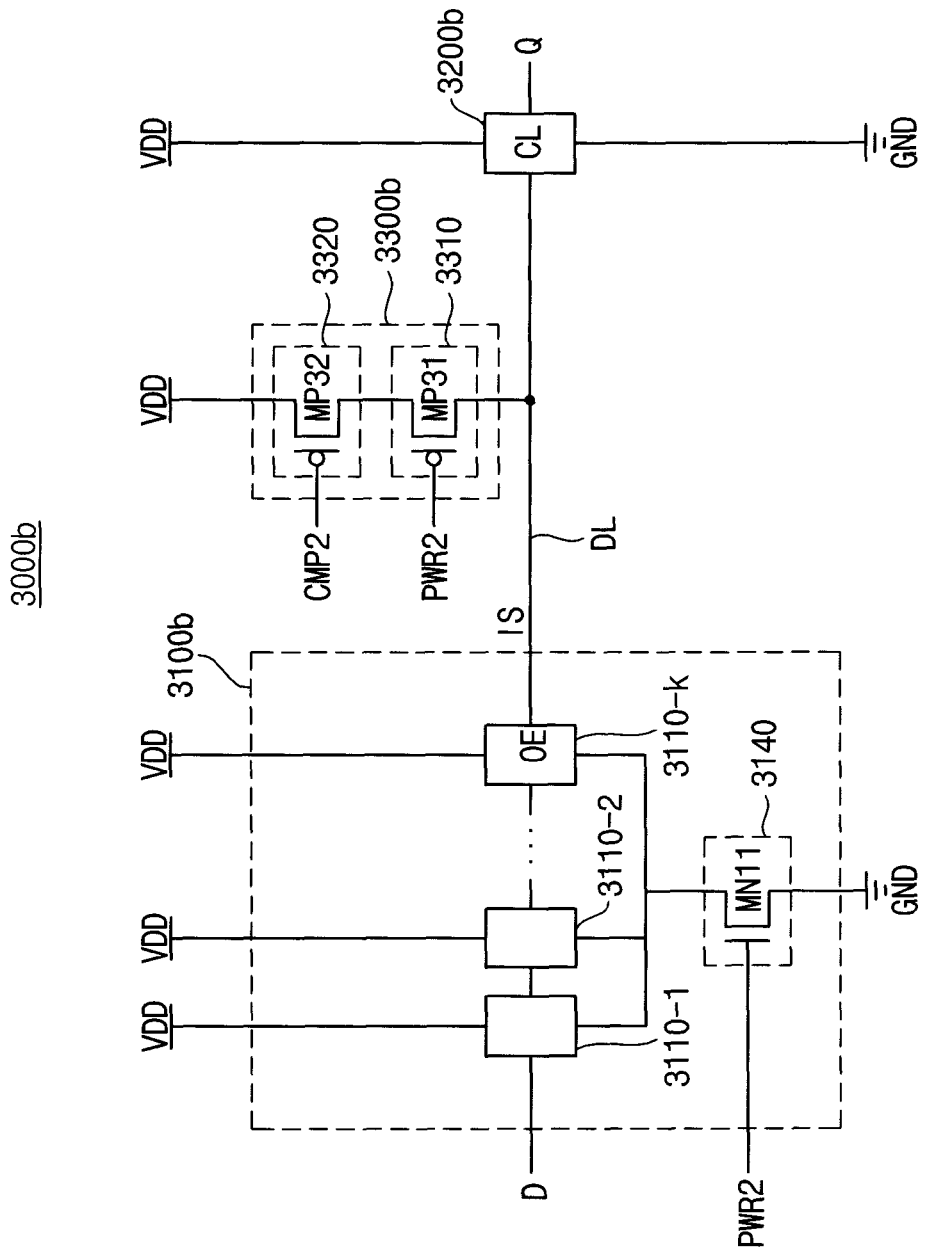

FIG. 10 is a block diagram illustrating another example of the semiconductor device of FIG. 8.

Referring to FIG. 10, a semiconductor device 3000b includes a power gating unit 3100b, a combinational logic unit 3200b and a clamping unit 3300b.

The combinational logic unit 3200b and the clamping unit 3300b included in the semiconductor device 3000b of FIG. 10 may have the same structure as the combinational logic unit 3200a and the clamping unit 3300a included in the semiconductor device 3000a of FIG. 9. Thus, a detailed description of the combinational logic unit 3200b and the clamping unit 3300b will be omitted.

The power gating unit 3100b may include at least one logic block 3110-1, 3110-2, . . . , 3110-k connected in series and an eighth power switch 3140.

Each of the at least one logic block 3110-1, 3110-2, . . . , 3110-k may be connected to the supply voltage VDD.

The at least one logic block 3110-1, 3110-2, . . . , 3110-k included in the power gating unit 3100b of FIG. 10 may have the same structure as the at least one logic block 2110-1, 2110-2, . . . , 2110-k included in the power gating unit 2100a of FIG. 3. Thus, a detailed description of the at least one logic block 3110-1, 3110-2, . . . , 3110-k will be omitted.

The eighth power switch 3140 may be connected between each of the at least one logic block 3110-1, 3110-2, . . . , 3110-k and the ground voltage GND. The eighth power switch 3140 may be closed in the first operation mode and be opened in the second operation mode in response to the second power control signal PWR2. For example, the eighth power switch 3140 may be closed in the first operation mode to connect the ground voltage GND to each of the at least one logic block 3110-1, 3110-2, . . . , 3110-k so that the at least one logic block 3110-1, 3110-2, . . . , 3110-k performs a normal operation to generate the internal signal IS, and be opened in the second operation mode to separate the ground voltage GND from each of the at least one logic block 3110-1, 3110-2, . . . , 3110-k so that the output electrode OE of the power gating unit 3100b is floated.

In some example embodiments, the eighth power switch 3140 may include the NMOS transistor MN11 having a source connected to the ground voltage GND, a drain connected to each of the at least one logic block 3110-1, 3110-2, . . . , 3110-k, and a gate to which the second power control signal PWR2 is applied. In this case, the power gating unit 3100b may operate in the first operation mode when the second power control signal PWR2 is in the logic high level and operate in the second operation mode when the second power control signal PWR2 is in the logic low level. Therefore, the NMOS transistor MN11 may be turned on in the first operation mode and be turned off in the second operation mode.

The power gating unit 3100b may be embodied by a standard cell having the footer structure.

Figure 13:
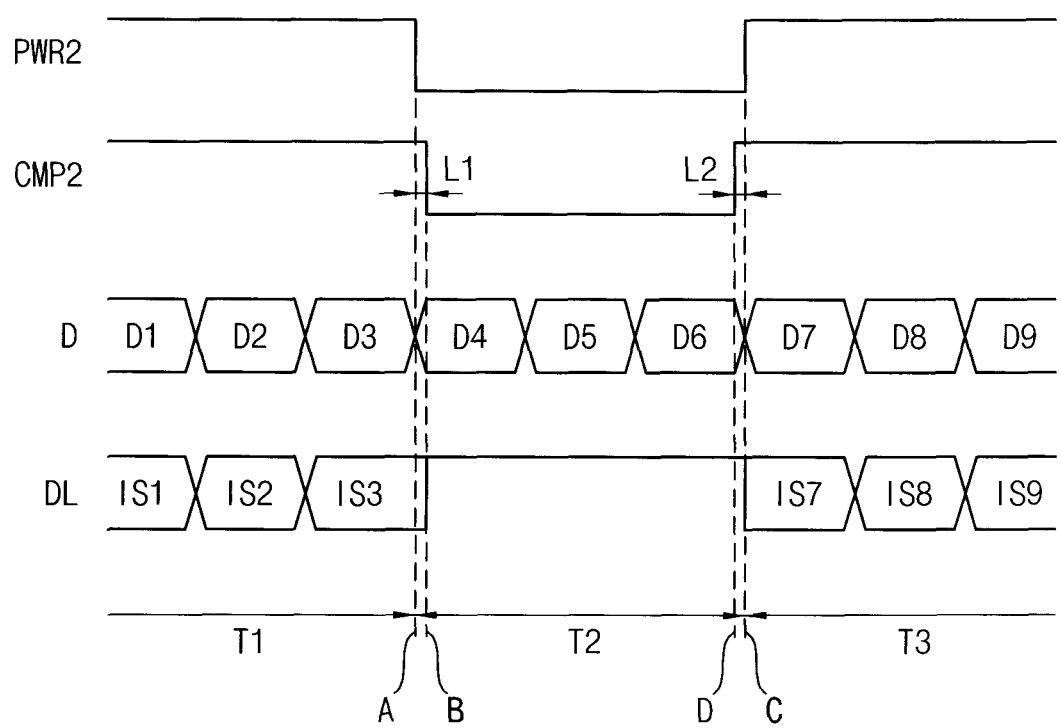
FIG. 13 is a timing diagram for describing an operation of the semiconductor device of FIG. 10 according to an example embodiment.

FIG. 13 is a timing diagram for describing an operation of the semiconductor device of FIG. 10.

The timing diagram of FIG. 13 is the same as the timing diagram of FIG. 12 except that the timing diagram of FIG. 13 does not include a waveform of the first power control signal PWR1.

Referring to FIG. 13, the semiconductor device 3000b may operate in the first operation mode during the first period T1 and the third period T3, and operate in the second operation mode during the second period T2.

In the first period T1 and the third period T3, the second power control signal PWR2 is kept in the logic high level. Therefore, the eighth power switch 3140, which includes the NMOS transistor MN11, included in the power gating unit 3100b may be closed so that the at least one logic block 3110-1, 3110-2, . . . , 3110-k performs a normal operation to generate the internal signal IS. In the first period T1 and the third period T3, both the second power control signal PWR2 and the second clamp control signal CMP2 are kept in the logic high level. Therefore, both the third clamp switch 3310, which includes the PMOS transistor MP31, and the fourth clamp switch 3320, which includes the PMOS transistor MP32, included in the clamping unit 3300b may be opened so that the clamping unit 3300b does not influence the logic level of the data line DL.

In the second period T2, the second power control signal PWR2 is kept in the logic low level. Therefore, the eighth power switch 3140, which includes the NMOS transistor MN11, included in the power gating unit 3100b may be opened so that the output electrode OE of the power gating unit 3100b is floated. However, in the second period T2, both the second power control signal PWR2 and the second clamp control signal CMP2 are in the logic low level. Therefore, both the third clamp switch 3310, which includes the PMOS transistor MP31, and the fourth clamp switch 3320, which includes the PMOS transistor MP32, included in the clamping unit 3300b may be closed so that the logic level of the data line DL may be clamped at the logic high level during the second period T2 even if the output electrode OE of the power gating unit 3100b is floated.

The clamping unit 3300b included in the semiconductor device 3000b of FIG. 10 may have the same structure as the clamping unit 3300a included in the semiconductor device 3000a of FIG. 9, and an operation of the clamping unit 3300a is described with reference to FIGS. 9 and 12. Thus, a detailed description of an operation of the clamping unit 3300b will be omitted.

Figure 11:
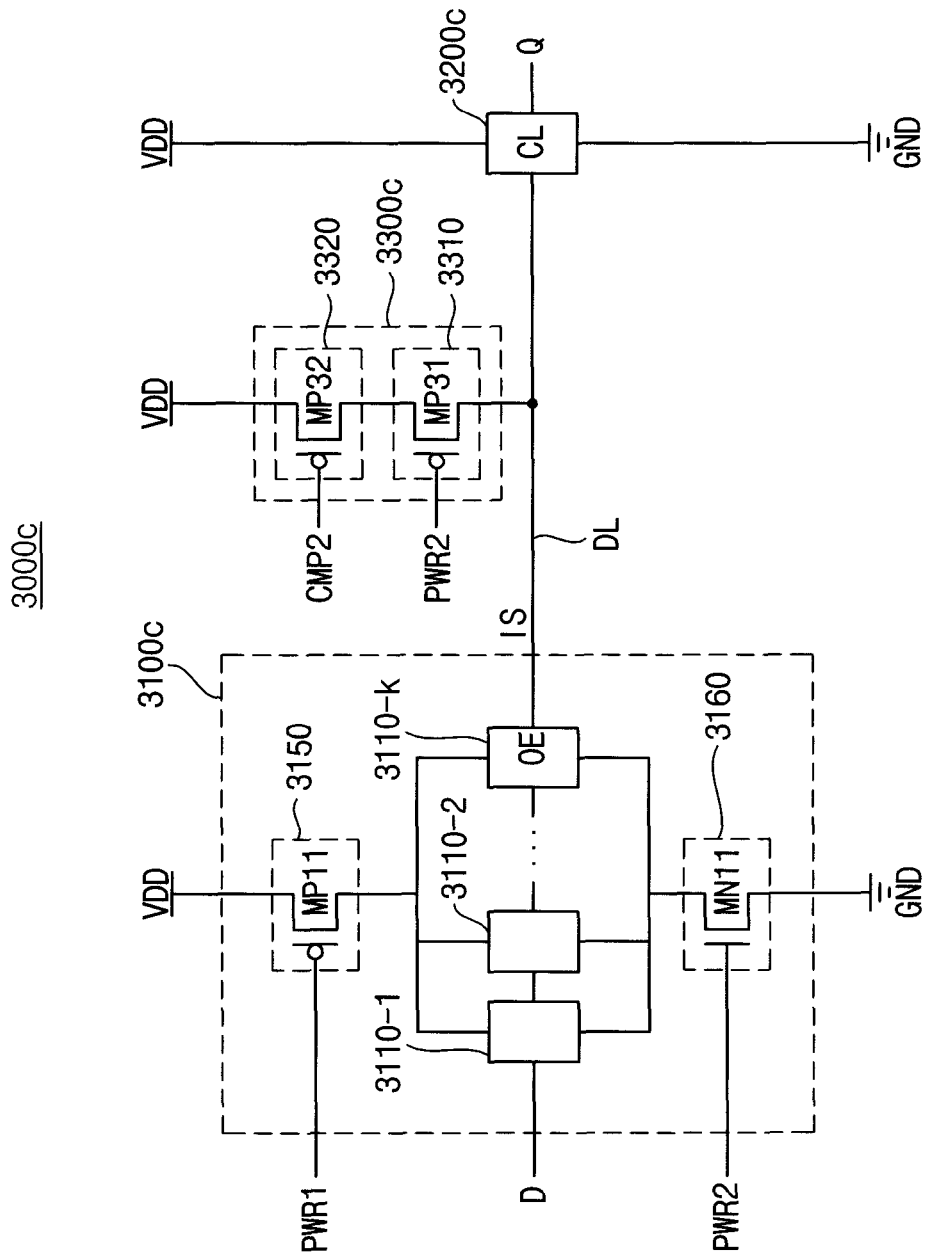

FIG. 11 is a block diagram illustrating still another example of the semiconductor device of FIG. 8.

Referring to FIG. 11, a semiconductor device 3000c includes a power gating unit 3100c, a combinational logic unit 3200c and a clamping unit 3300c.

The combinational logic unit 3200c and the clamping unit 3300c included in the semiconductor device 3000c of FIG. 11 may have the same structure as the combinational logic unit 3200a and the clamping unit 3300a included in the semiconductor device 3000a of FIG. 9. Thus, a detailed description of the combinational logic unit 3200c and the clamping unit 3300c will be omitted.

The power gating unit 3100c may include at least one logic block 3110-1, 3110-2, ..., 3110-k connected in series, a ninth power switch 3150 and a tenth power switch 3160.

The at least one logic block 3110-1, 3110-2, ..., 3110-k included in the power gating unit 3100c of FIG. 10 may have the same structure as the at least one logic block 2110-1, 2110-2, ..., 2110-k included in the power gating unit 2100a of FIG. 3. Thus, a detailed description of the at least one logic block 3110-1, 3110-2, ..., 3110-k will be omitted.

The ninth power switch 3150 and the tenth power switch 3160 included in the power gating unit 3100c of FIG. 10 may have the same structure as the fourth power switch 2150 and the fifth power switch 2160 included in the power gating unit 2100c of FIG. 5. Thus, a detailed description of the ninth power switch 3150 and the tenth power switch 3160 will be omitted.

The power gating unit 3100c may be embodied by a standard cell having the header and footer structure.

FIG. 12 is a timing diagram for describing an operation of the semiconductor device of FIG. 11.

Referring to FIG. 12, the semiconductor device 3000c may operate in the first operation mode during the first period T1 and the third period T3, and operate in the second operation mode during the second period T2.

In the first period T1 and the third period T3, the first power control signal PWR1 is kept in the logic low level and the second power control signal PWR2 is kept in the logic high level. Therefore, both the ninth power switch 3150, which includes the PMOS transistor MP11, and the tenth power switch 3160, which includes the NMOS transistor MN11, included in the power gating unit 3100c may be closed so that the at least one logic block 3110-1, 3110-2, ..., 3110-k performs a normal operation to generate the internal signal IS. In the first period T1 and the third period T3, both the second power control signal PWR2 and the second clamp control signal CMP2 are kept in the logic high level. Therefore, both the third clamp switch 3310, which includes the PMOS transistor MP31, and the fourth clamp switch 3320, which includes the PMOS transistor MP32, included in the clamping unit 3300c may be opened so that the clamping unit 3300c does not influence the logic level of the data line DL.

In the second period T2, the first power control signal PWR1 is kept in the logic high level and the second power control signal PWR2 is kept in the logic low level. Therefore, both the ninth power switch 3150, which includes the PMOS transistor MP11, and the tenth power switch 3160, which includes the NMOS transistor MN11, included in the power gating unit 3100c may be opened so that the output electrode OE of the power gating unit 3100c is floated. However, in the second period T2, both the second power control signal PWR2 and the second clamp control signal CMP2 are in the logic low level. Therefore, both the third clamp switch 3310, which includes the PMOS transistor MP31, and the fourth clamp switch 3320, which includes the PMOS transistor MP32, included in the clamping unit 3300c may be closed so that the logic level of the data line DL may be clamped at the logic high level during the second period T2 even if the output electrode OE of the power gating unit 3100c is floated.

The clamping unit 3300c included in the semiconductor device 3000c of FIG. 11 may have the same structure as the clamping unit 3300a included in the semiconductor device 3000a of FIG. 9, and an operation of the clamping unit 3300a is described with reference to FIGS. 9 and 12. Thus, a detailed description of an operation of the clamping unit 3300c will be omitted.

Figure 14:
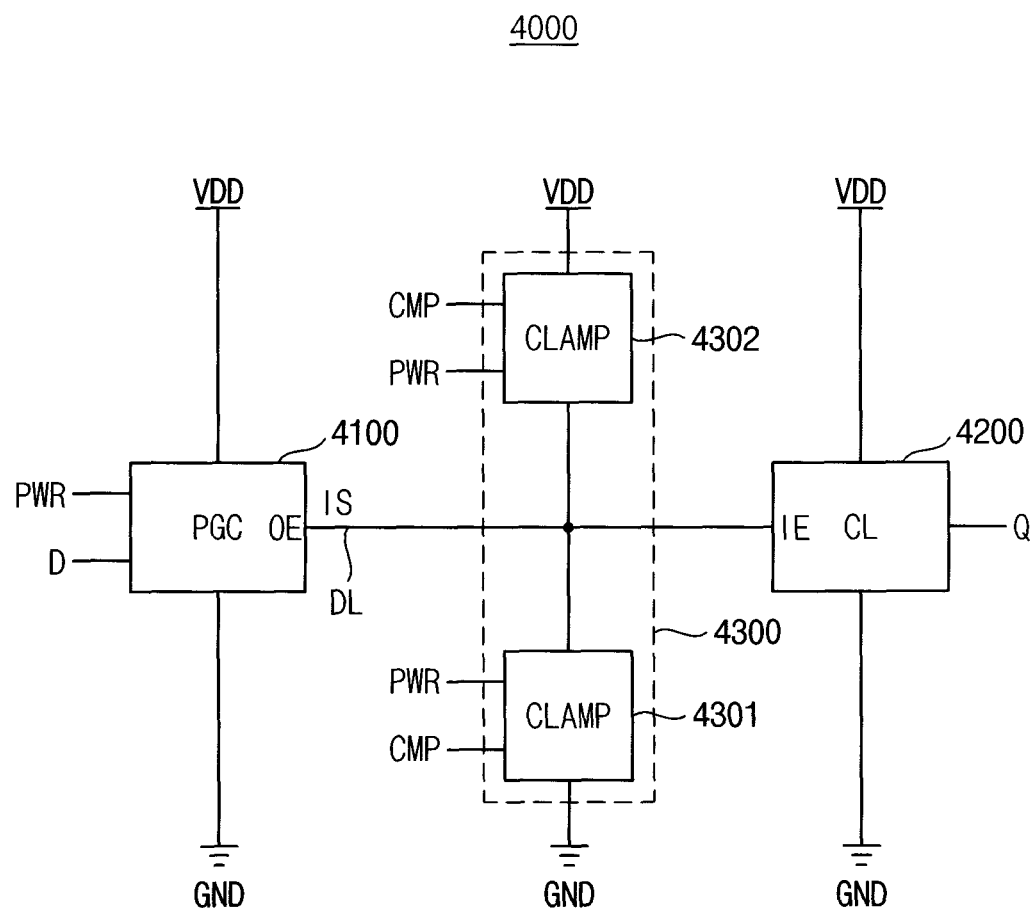
FIG. 14 is a block diagram illustrating still another example of the semiconductor device of FIG. 1.

FIG. 14 is a block diagram illustrating still another example of a semiconductor device of FIG. 1.

Referring to FIG. 14, a semiconductor device 4000 includes a power gating unit PGC 4100, a combinational logic unit CL 4200 and a clamping unit CLAMP 4300.

The power gating unit 4100 and the combinational logic unit 4200 included in the semiconductor device 4000 of FIG. 14 may have the same structure as the power gating unit 1100 and the combinational logic unit 1200 included in the semiconductor device 1000 of FIG. 1. Thus, a detailed description of the power gating unit 4100 and the combinational logic unit 4200 will be omitted.

The clamping unit 4300 may include a first clamping unit 4301 connected between the data line DL and the ground voltage GND and a second clamping unit 4302 connected between the data line DL and the supply voltage VDD. The first clamping unit 4301 and the second clamping unit 4302 may be turned off in the first operation mode, and one of the first clamping unit 4301 and the second clamping unit 4302 may be turned on to clamp the internal signal IS of the data line DL at the logic low level or at the logic high level in the second operation mode. For example, the first clamping unit 4301 may not influence a logic level of the data line DL by disconnecting the data line DL from the ground voltage GND and the second clamping unit 4302 may not influence the logic level of the data line DL by disconnecting the data line DL from the supply voltage VDD in the first operation mode. The first clamping unit 4301 may clamp the internal signal IS of the data line DL at the logic low level by connecting the data line DL to the ground voltage GND or the second clamping unit 4302 may clamp the internal signal IS of the data line DL at the logic high level by connecting the data line DL to the supply voltage VDD in the second operation mode.

Figure 15:
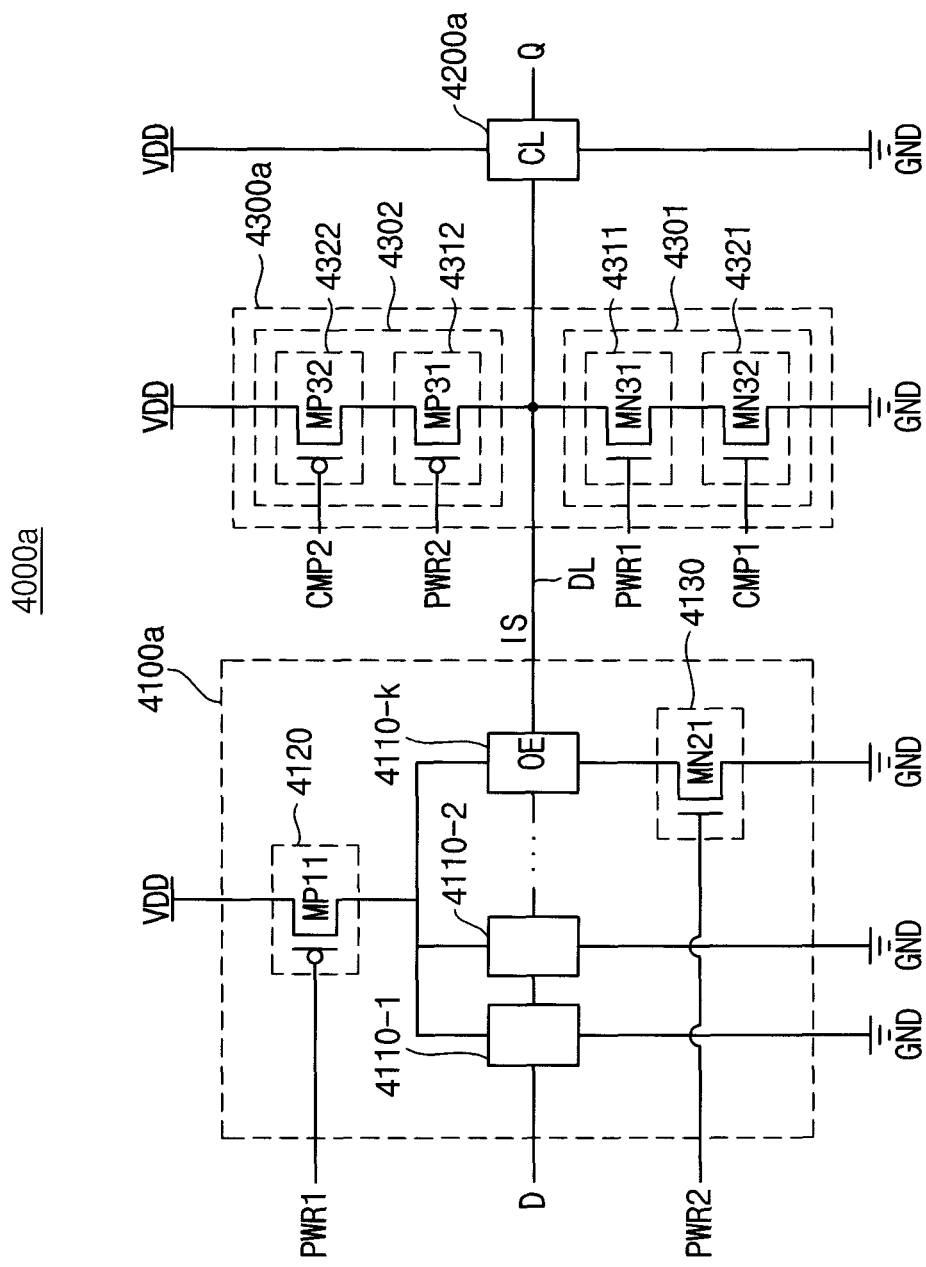
FIGS. 15, 16 and 17 are block diagrams illustrating examples of the semiconductor device of FIG. 14.

FIG. 15 is a block diagram illustrating an example of a semiconductor device of FIG. 14.

Referring to FIG. 15, a semiconductor device 4000a includes a power gating unit 4100a, a combinational logic unit 4200a and a clamping unit 4300a.

The power gating unit 4100a may include at least one logic block 4110-1, 4110-2, ..., 4110-k connected in series, an eleventh power switch 4120 and a twelfth switch 4130.

Each of the at least one logic block 4110-1, 4110-2, ..., 4110-k except for a last logic block 4110-k connected in a last stage among the at least one logic block 4110-1, 4110-2, ..., 4110-k may be connected to the ground voltage GND.

The at least one logic block 4110-1, 4110-2, ..., 4110-k included in the power gating unit 4100a of FIG. 15 may have the same structure as the at least one logic block 2110-1, 2110-2, ..., 2110-k included in the power gating unit 2100a of FIG. 3. Thus, a detailed description of the at least one logic block 4110-1, 4110-2, . . . , 4110-k will be omitted.

The eleventh power switch 4120 may be connected between each of the at least one logic block 4110-1, 4110-2, . . . , 4110-k and the supply voltage VDD. The eleventh power switch 4120 may be closed in the first operation mode and be opened in the second operation mode in response to the first power control signal PWR1.

The twelfth power switch 4130 may be connected between the last logic block 4110-k and the ground voltage GND. The twelfth power switch 4130 may be closed in the first operation mode and be opened in the second operation mode in response to the second power control signal PWR2.

The eleventh power switch 4120 and the twelfth power switch 4130 included in the power gating unit 4100a of FIG. 15 may have the same structure as the sixth power switch 3120 and the seventh power switch 3130 included in the power gating unit 3100a of FIG. 9. Thus, a detailed description of the eleventh power switch 4120 and the twelfth power switch 4130 will be omitted.

The clamping unit 4300a may include the first clamping unit 4301 and the second clamping unit 4302.

The first clamping unit 4301 may include a fifth clamp switch 4311 and a sixth clamp switch 4321. The fifth clamp switch 4311 may be connected between the data line DL and the sixth clamp switch 4321, and the sixth clamp switch 4321 may be connected between the fifth clamp switch 4311 and the ground voltage GND. The fifth clamp switch 4311 may be closed or opened in response to the first power control signal PWR1, and the sixth clamp switch 4321 may be closed or opened in response to the first clamp control signal CMP1.

The second clamping unit 4302 may include a seventh clamp switch 4312 and an eighth clamp switch 4322. The seventh clamp switch 4312 may be connected between the data line DL and the eighth clamp switch 4322, and the eighth clamp switch 4322 may be connected between the seventh clamp switch 4312 and the supply voltage VDD. The seventh clamp switch 4312 may be closed or opened in response to the second power control signal PWR2, and the eighth clamp switch 4322 may be closed or opened in response to the second clamp control signal CMP2.

As will be described later, the first power control signal PWR1 and the first clamp control signal CMP1 may transit consecutively with a time interval in the second operation mode while the second clamp control signal CMP2 is kept in the logic high level so that the fifth clamp switch 4311 and the sixth clamp switch 4321 are closed or opened at different times separated by the time interval in the second operation mode while the eighth clamp switch 4322 is kept opened, or the second power control signal PWR2 and the second clamp control signal CMP2 may transit consecutively with a time interval in the second operation mode while the first clamp control signal CMP1 is kept in the logic low level so that the seventh clamp switch 4312 and the eighth clamp switch 4322 are closed or opened at different times separated by the time interval in the second operation mode while the sixth clamp switch 4321 is kept opened. For example, the fifth clamp switch 4311 and the sixth clamp switch 4321 are closed at different times separated by an interval of a first reference period and are opened at different times separated by an interval of a second reference period in the second operation mode while the eighth clamp switch 4322 is kept opened, or the seventh clamp switch 4312 and the eighth clamp switch 4322 are closed at different times separated by an interval of a third reference period and are opened at different times separated by an interval of a fourth reference period in the second operation mode while the sixth clamp switch 4321 is kept opened.

The first clamping unit 4301 included in the clamping unit 4300a of FIG. 15 may have the same structure as the clamping unit 2300a of FIG. 3 and the second clamping unit 4302 included in the clamping unit 4300a of FIG. 15 may have the same structure as the clamping unit 3300a of FIG. 9. Thus, a detailed description of the first clamping unit 4301 and the second clamping unit 4302 will be omitted.

Figure 16:
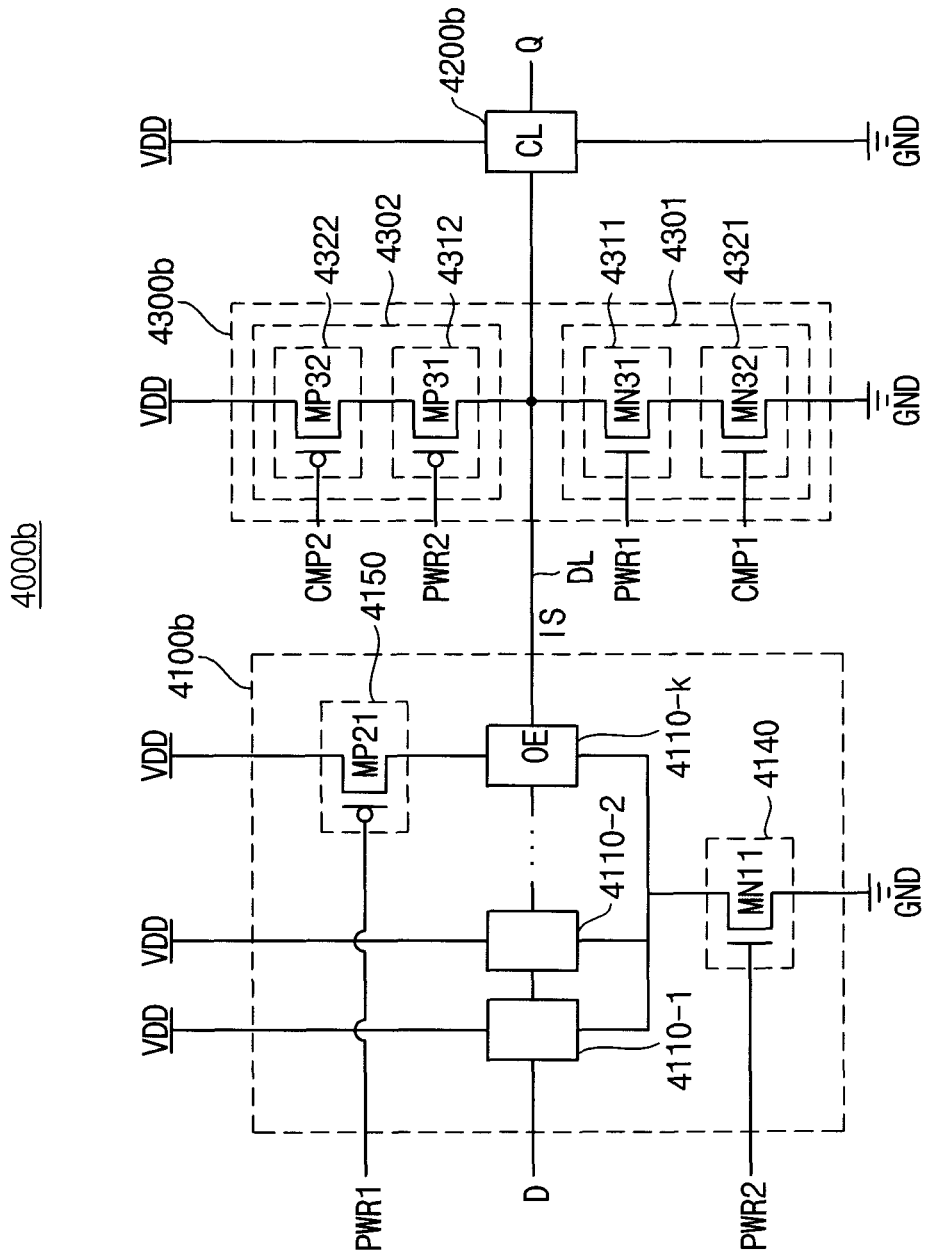

FIG. 16 is a block diagram illustrating another example of the semiconductor device of FIG. 14.

Referring to FIG. 16, a semiconductor device 4000b includes a power gating unit 4100b, a combinational logic unit 4200b and a clamping unit 4300b.

The combinational logic unit 4200b and the clamping unit 4300b included in the semiconductor device 4000b of FIG. 16 may have the same structure as the combinational logic unit 4200a and the clamping unit 4300a included in the semiconductor device 4000a of FIG. 15. Thus, a detailed description of the combinational logic unit 4200b and the clamping unit 4300b will be omitted.

The power gating unit 4100b may include at least one logic block 4110-1, 4110-2, . . . , 4110-k connected in series, a thirteenth power switch 4140 and a fourteenth power switch 4150.

Each of the at least one logic block 4110-1, 4110-2, . . . , 4110-k except for a last logic block 4110-k connected in a last stage among the at least one logic block 4110-1, 4110-2, . . . , 4110-k may be connected to the supply voltage VDD.

The at least one logic block 4110-1, 4110-2, . . . , 4110-k included in the power gating unit 4100b of FIG. 16 may have the same structure as the at least one logic block 2110-1, 2110-2, . . . , 2110-k included in the power gating unit 2100a of FIG. 3. Thus, a detailed description of the at least one logic block 4110-1, 4110-2, . . . , 4110-k will be omitted.

The thirteenth power switch 4140 may be connected between each of the at least one logic block 4110-1, 4110-2, . . . , 4110-k and the ground voltage GND. The thirteenth power switch 4140 may be closed in the first operation mode and be opened in the second operation mode in response to the second power control signal PWR2.

The fourteenth power switch 4150 may be connected between the last logic block 4110-k and the supply voltage VDD. The fourteenth power switch 4150 may be closed in the first operation mode and be opened in the second operation mode in response to the first power control signal PWR1.

The thirteenth power switch 4140 and the fourteenth power switch 4150 included in the power gating unit 4100b of FIG. 16 may have the same structure as the second power switch 2130 and the third power switch 2140 included in the power gating unit 2100b of FIG. 4. Thus, a detailed description of the thirteenth power switch 4140 and the fourteenth power switch 4150 will be omitted.

Figure 17:
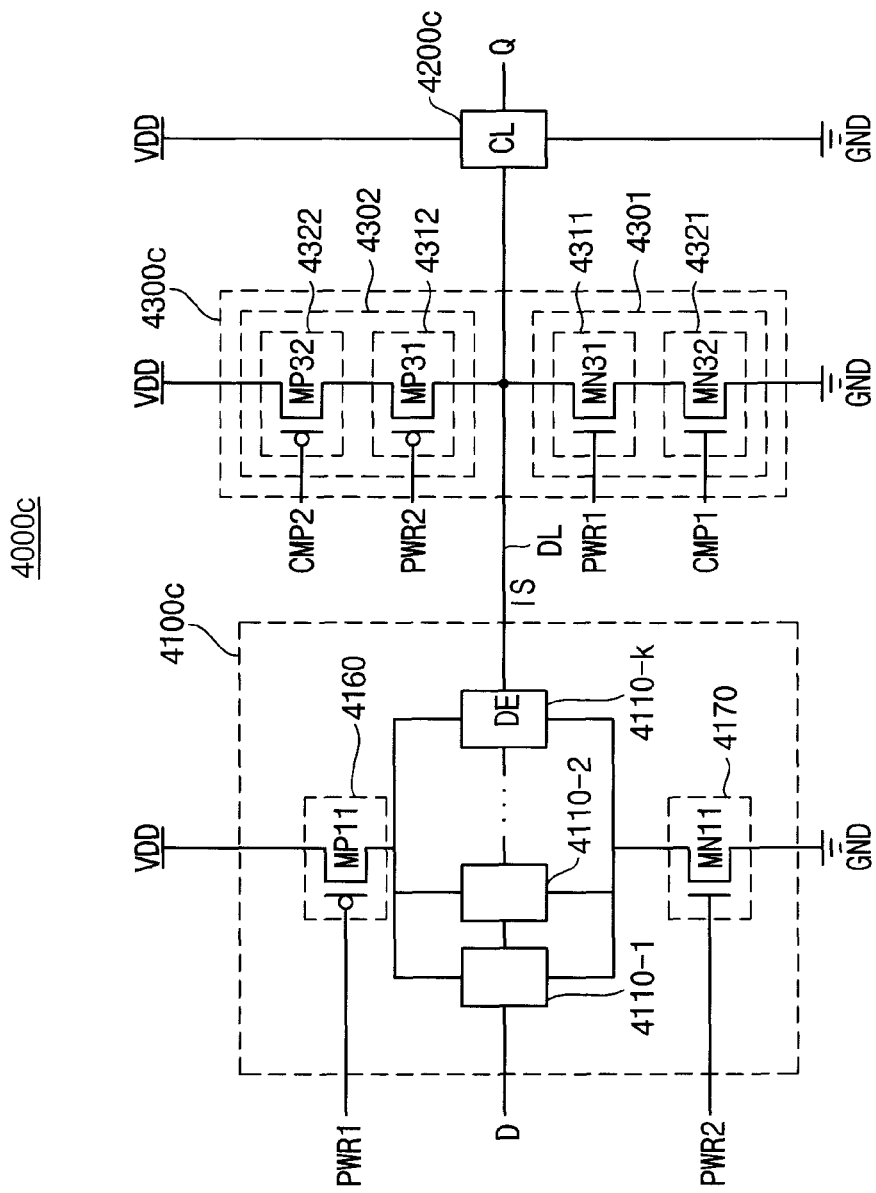

FIG. 17 is a block diagram illustrating still another example of the semiconductor device of FIG. 14.

Referring to FIG. 17, a semiconductor device 4000c includes a power gating unit 4100c, a combinational logic unit 4200c and a clamping unit 4300c.

The combinational logic unit 4200c and the clamping unit 4300c included in the semiconductor device 4000c of FIG. 17 may have the same structure as the combinational logic unit 4200a and the clamping unit 4300a included in the semiconductor device 4000a of FIG. 15. Thus, a detailed description of the combinational logic unit 4200c and the clamping unit 4300c will be omitted.

The power gating unit 4100c may include at least one logic block 4110-1, 4110-2, ..., 4110-k connected in series, a fifteenth power switch 4160 and a sixteenth power switch 4170.

The at least one logic block 4110-1, 4110-2, ..., 4110-k included in the power gating unit 4100c of FIG. 17 may have the same structure as the at least one logic block 2110-1, 2110-2, ..., 2110-k included in the power gating unit 2100a of FIG. 3. Thus, a detailed description of the at least one logic block 4110-1, 4110-2, ..., 4110-k will be omitted.

The fifteenth power switch 4160 may be connected between each of the at least one logic block 4110-1, 4110-2, ..., 4110-k and the supply voltage VDD. The fifteenth power switch 4160 may be closed in the first operation mode and be opened in the second operation mode in response to the first power control signal PWR1.

The sixteenth power switch 4170 may be connected between each of the at least one logic block 4110-1, 4110-2, ..., 4110-k and the ground voltage GND. The sixteenth power switch 4170 may be closed in the first operation mode and be opened in the second operation mode in response to the second power control signal PWR2.

The fifteenth power switch 4160 and the sixteenth power switch 4170 included in the power gating unit 4100c of FIG. 17 may have the same structure as the fourth power switch 2150 and the fifth power switch 2160 included in the power gating unit 2100c of FIG. 5. Thus, a detailed description of the fifteenth power switch 4160 and the sixteenth power switch 4170 will be omitted.

Figure 18:
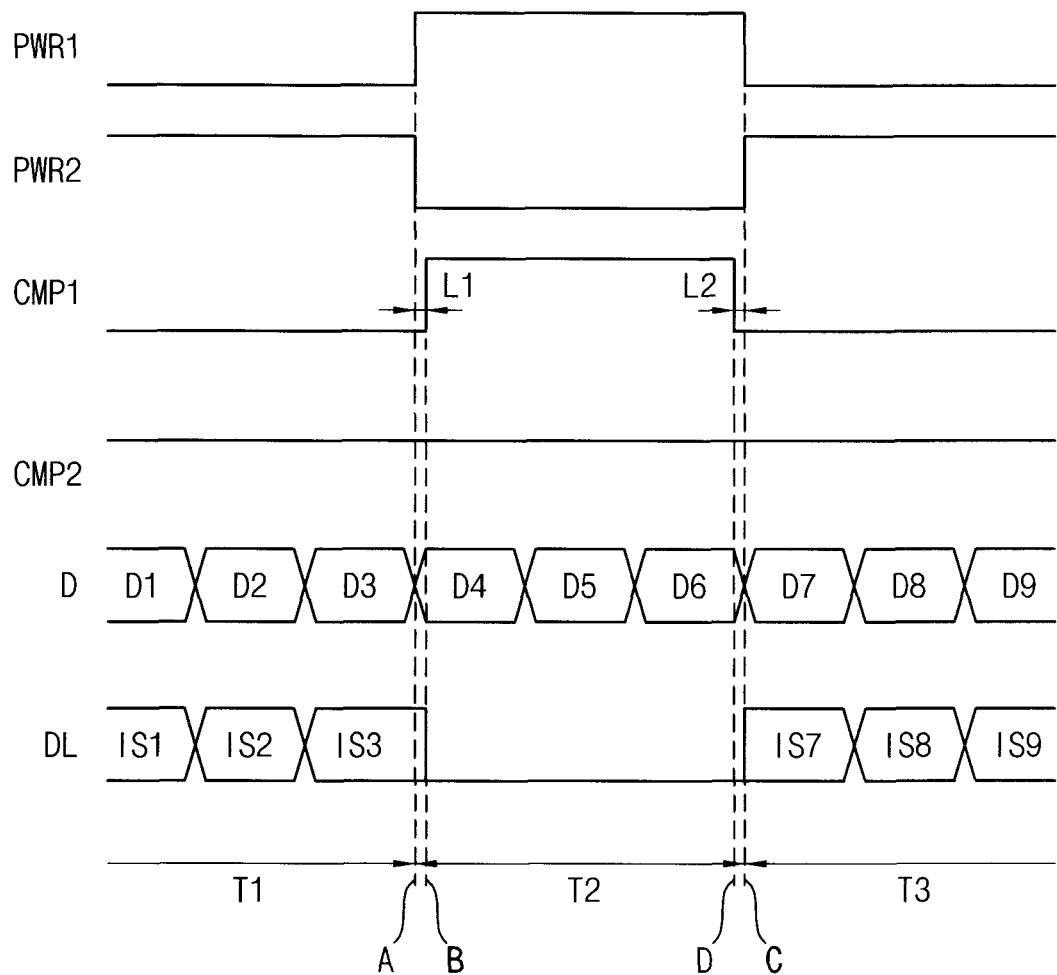
FIGS. 18 and 19 are timing diagrams for describing an operation of semiconductor devices of FIGS. 15, 16 and 17 according to example embodiments.
Figure 19:
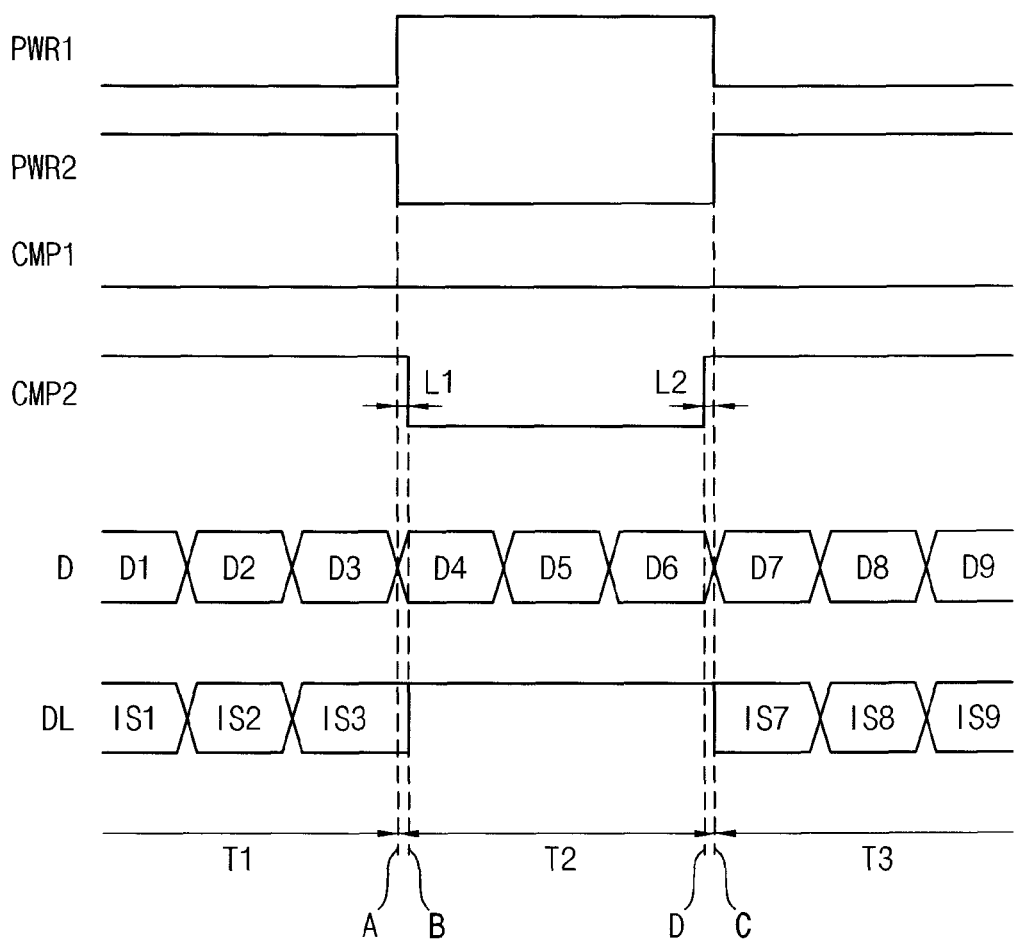

FIGS. 18 and 19 are timing diagrams for describing an operation of semiconductor devices of FIGS. 15, 16 and 17.

In FIG. 18, the semiconductor device 4000a of FIG. 15, the semiconductor device 4000b of FIG. 16 and the semiconductor device 4000c of FIG. 17 clamp the logic level of the data line DL at the logic low level in the second operation mode. In FIG. 19, the semiconductor device 4000a of FIG. 15, the semiconductor device 4000b of FIG. 16 and the semiconductor device 4000c of FIG. 17 clamp the logic level of the data line DL at the logic high level in the second operation mode.

Referring to FIGS. 18 and 19, the semiconductor devices 4000a, 4000b and 4000c may operate in the first operation mode during the first period T1 and the third period T3, and operate in the second operation mode during the second period T2.

As illustrated in FIG. 18, if the semiconductor devices 4000a, 4000b and 4000c clamp the logic level of the data line DL at the logic low level in the second operation mode, the second clamp control signal CMP2 may be kept in the logic high level regardless of the operation modes so that the eighth clamp switch 4322 is kept opened regardless of the operation modes. Therefore, the data line DL may be always disconnected from the supply voltage VDD. On the other hand, the first clamp control signal CMP1 may transit according to the operation modes to selectively connect the data line DL to the ground voltage GND.

As illustrated in FIG. 19, if the semiconductor devices 4000a, 4000b and 4000c clamp the logic level of the data line DL at the logic high level in the second operation mode, the first clamp control signal CMP1 may be kept in the logic low level regardless of the operation modes so that the sixth clamp switch 4321 is kept opened regardless of the operation modes. Therefore, the data line DL may be always disconnected from the ground voltage GND. On the other hand, the second clamp control signal CMP2 may transit according to the operation modes to selectively connect the data line DL to the supply voltage VDD.

When the semiconductor device 4000a of FIG. 15 clamps the logic level of the data line DL at the logic low level in the second operation mode, the semiconductor device 4000a of FIG. 15 may operate the same as the semiconductor device 2000a of FIG. 3. The operation of the semiconductor device 2000a is described with reference to FIGS. 3 and 6. Thus, a detailed description of an operation of the semiconductor device 4000a will be omitted.

When the semiconductor device 4000a of FIG. 15 clamps the logic level of the data line DL at the logic high level in the second operation mode, the semiconductor device 4000a of FIG. 15 may operate the same as the semiconductor device 3000a of FIG. 9. The operation of the semiconductor device 3000a is described with reference to FIGS. 9 and 12. Thus, a detailed description of an operation of the semiconductor device 4000a will be omitted.

When the semiconductor device 4000b of FIG. 16 clamps the logic level of the data line DL at the logic low level in the second operation mode, the semiconductor device 4000b of FIG. 16 may operate the same as the semiconductor device 2000b of FIG. 4. The operation of the semiconductor device 2000b is described with reference to FIGS. 4 and 7. Thus, a detailed description of an operation of the semiconductor device 4000b will be omitted.

When the semiconductor device 4000b of FIG. 16 clamps the logic level of the data line DL at the logic high level in the second operation mode, the semiconductor device 4000b of FIG. 16 may operate the same as the semiconductor device 3000b of FIG. 10. The operation of the semiconductor device 3000b is described with reference to FIGS. 10 and 13. Thus, a detailed description of an operation of the semiconductor device 4000b will be omitted.

When the semiconductor device 4000c of FIG. 17 clamps the logic level of the data line DL at the logic low level in the second operation mode, the semiconductor device 4000c of FIG. 17 may operate the same as the semiconductor device 2000c of FIG. 5. The operation of the semiconductor device 2000c is described with reference to FIGS. 5 and 7. Thus, a detailed description of an operation of the semiconductor device 4000c will be omitted.

When the semiconductor device 4000c of FIG. 17 clamps the logic level of the data line DL at the logic high level in the second operation mode, the semiconductor device 4000c of FIG. 17 may operate the same as the semiconductor device 3000c of FIG. 11. The operation of the semiconductor device 3000c is described with reference to FIGS. 11 and 12. Thus, a detailed description of an operation of the semiconductor device 4000c will be omitted.

Figure 20:
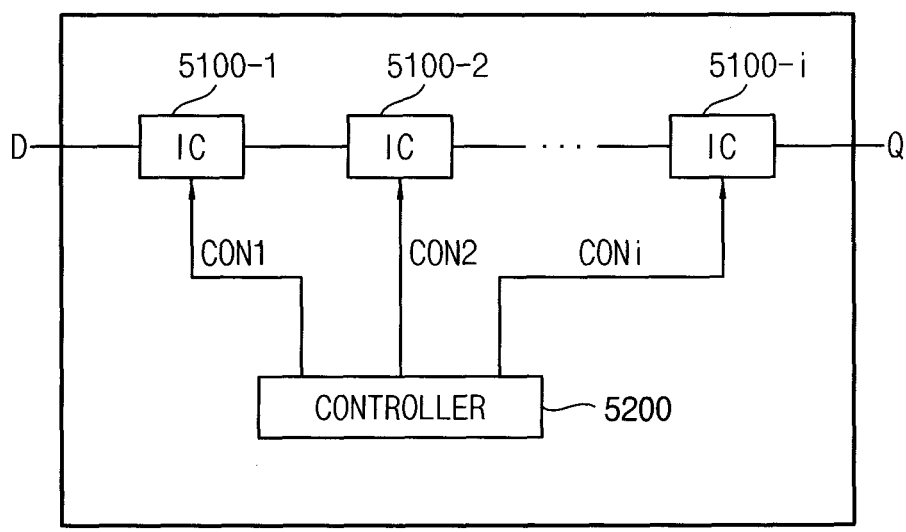
FIG. 20 is a block diagram illustrating a system-on-chip according to example embodiments.

FIG. 20 is a block diagram illustrating a system-on-chip according to example embodiments.

Referring to FIG. 20, a system-on-chip 5000 include a plurality of semiconductor devices IC 5100-1, 5100-2, ..., 5100-i (i is an integer more than two) connected in series and a controller 5200.

Each of the plurality of semiconductor devices 5100-1, 5100-2, ..., 5100-i generates an output signal in response to control signals CON1, CON2, ..., CONi received from the controller 5200.

A first semiconductor device 5100-1 connected in a first stage among the plurality of semiconductor devices 5100-1, 5100-2, ..., 5100-i may receive an input signal D from outside, perform a logical operation on the input signal D, and generate an output signal. Other semiconductor devices 5100-2, ..., 5100-i may receive an output signal of a semiconductor device connected in a previous stage, perform a logical operation on the received output signal, and generate an output signal. A last semiconductor device 5100-i connected in a last stage among the plurality of semiconductor devices 5100-1, 5100-2, . . . , 5100-i may generate an output signal Q and provide the output signal Q to outside.

Each of the plurality of semiconductor devices 5100-1, 5100-2, . . . , 5100-i includes a power gating unit, a combinational logic unit and a clamping unit.

The power gating unit is turned on to output an internal signal at an output electrode based on an input signal or turned off according to operation modes determined by a corresponding control signal among the control signals CON1, CON2, . . . , CONi.

The combinational logic unit includes an input electrode directly connected to the output electrode of the power gating unit through a data line, and outputs the output signal based on the internal signal received through the data line.

The clamping unit is turned on to clamp the internal signal of the data line at a logic high level or at a logic low level or turned off according to the operation modes.

Each of the plurality of semiconductor devices 5100-1, 5100-2, . . . , 5100-i may include one of the semiconductor devices 2000a, 2000b, 2000c, 3000a, 3000b, 3000c, 4000a, 4000b and 4000c described with reference to FIGS. 3, 4, 5, 9, 10, 11, 15, 16 and 17, respectively.

The structure and the operation of the semiconductor devices 2000a, 2000b, 2000c, 3000a, 3000b, 3000c, 4000a, 4000b and 4000c are described above. Thus, a detailed description of the plurality of semiconductor devices 5100-1, 5100-2, . . . , 5100-i will be omitted.

The controller 5200 provides the control signals CON1, CON2, . . . , CONi to the plurality of semiconductor devices 5100-1, 5100-2, . . . , 5100-i, respectively. Each of the control signals CON1, CON2, . . . , CONi may include at least one power control signal and at least one clamp control signal. The controller 5200 may control the operation modes of the plurality of semiconductor devices 5100-1, 5100-2, . . . , 5100-i and a logic level that the data line is clamped using the control signals CON1, CON2, . . . , CONi.

As described above, the semiconductor device according to example embodiments may be used in any system-on-chip that operates in a high speed for reducing power consumption since the semiconductor device clamps the output electrode of the power gating unit without degrading an operation speed of the semiconductor device.

The foregoing is illustrative of inventive concepts and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of inventive concepts as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A semiconductor device, comprising:
   a power gating unit including an output electrode, the power gating unit configured to output an internal signal at the output electrode based on an input signal and an operation mode, the operation mode being based on a power control signal;
   a combinational logic unit including an input electrode directly connected to the output electrode of the power gating unit through a data line, the combinational logic unit configured to generate an output signal based on the internal signal received through the data line; and
   a clamping unit including first and second clamp switches configured to receive first and second control signals, respectively, the first and second clamp switches connected in series and configured to at least clamp the internal signal at a logic high level or at a logic low level based on the operation mode, the first control signal and the second control signal being different, one of the first control signal and the second control signal being the power control signal.

2. The semiconductor device of claim 1, wherein the clamping unit is connected between the data line and a ground voltage, and the clamping unit is configured to turn off in a first operation mode and is configured to turn on to clamp the internal signal at the logic low level in a second operation mode.

3. The semiconductor device of claim 2, wherein the power gating unit includes:
   at least one logic block connected in series, each of the at least one logic block being operatively connected to the ground voltage; and
   a power switch connected between each of the at least one logic block and a supply voltage, the power switch configured to be closed in the first operation mode and opened in the second operation mode in response to the power control signal.

4. The semiconductor device of claim 2, wherein the clamping unit includes:
   the first clamp switch connected to the data line, the first clamp switch configured to be closed or opened in response to the first control signal; and
   the second clamp switch connected between the first clamp switch and the ground voltage, the second clamp switch configured to be closed or opened in response to the second control signal.

5. The semiconductor device of claim 4, wherein the first clamp switch and the second clamp switch are configured to close at different times separated by an interval of a first reference period, and are configured to open at different times separated by an interval of a second reference period in the second operation mode.

6. The semiconductor device of claim 1, wherein the clamping unit is connected between the data line and a supply voltage, and the clamping unit is configured to turn off in a first operation mode and is configured to turn on to clamp the internal signal at the logic high level in a second operation mode.

7. The semiconductor device of claim 6, wherein the power gating unit includes:
   at least one logic block connected in series, each of the at least one logic block being operatively connected to the supply voltage; and
   a power switch connected between each of the at least one logic block and a ground voltage, the power switch configured to be closed in the first operation mode and opened in the second operation mode in response to the power control signal.

8. The semiconductor device of claim 6, wherein the clamping unit includes:
   the first clamp switch connected to the data line, the first clamp switch configured to be closed or opened in response to the first control signal; and the second clamp switch connected between the first clamp switch and the supply voltage, the second clamp switch configured to be closed or opened in response to the second control signal.

9. The semiconductor device of claim 8, wherein the first clamp switch and the second clamp switch are configured to close at different times separated by an interval of a first reference period and are configured to open at different times separated by an interval of a second reference period in the second operation mode.

10. The semiconductor device of claim 1, wherein the clamping unit includes a first clamping unit connected between the data line and a ground voltage and a second clamping unit connected between the data line and a supply voltage, the first clamping unit and the second clamping unit configured to turn off in a first operation mode, and one of the first clamping unit and the second clamping unit is configured to turn on to clamp the internal signal at the logic low level or at the logic high level in a second operation mode.

11. A semiconductor device, comprising:
a power gating unit including an output electrode, the power gating unit configured to output an internal signal at the output electrode based on an input signal and an operation mode;
a combinational logic unit including an input electrode directly connected to the output electrode of the power gating unit through a data line, the combinational logic unit configured to generate an output signal based on the internal signal received through the data line; and
a clamping unit configured to at least clamp the internal signal at a logic high level or at a logic low level based on the operation mode, the clamping unit being connected between the data line and a ground voltage, and the clamping unit being configured to turn off in a first operation mode and is configured to turn on to clamp the internal signal at the logic low level in a second operation mode, the power gating unit including,
at least one logic block connected in series, each of the at least one logic block except for a last logic block connected in a last stage among the at least one logic block being directly connected to a supply voltage;
a first power switch connected between each of the at least one logic block and the ground voltage, the first power switch configured to be closed in the first operation mode and opened in the second operation mode in response to a first power control signal; and
a second power switch connected between the last logic block and the supply voltage, the second power switch configured to be closed in the first operation mode and opened in the second operation mode in response to a second power control signal.

12. A semiconductor device comprising:
a power gating unit including an output electrode, the power gating unit configured to output an internal signal at the output electrode based on an input signal and an operation mode;
a combinational logic unit including an input electrode directly connected to the output electrode of the power gating unit through a data line, the combinational logic unit configured to generate an output signal based on the internal signal received through the data line; and
a clamping unit configured to at least clamp the internal signal at a logic high level or at a logic low level based on the operation mode, the clamping unit being connected between the data line and a supply voltage, in the clamping unit being configured to turn off in a first operation mode and is configured to turn on to clamp the internal signal at the logic high level in a second operation mode, the power gating unit including,
at least one logic block connected in series, each of the at least one logic block except for a last logic block connected in a last stage among the at least one logic block being directly connected to a ground voltage;
a first power switch connected between each of the at least one logic block and the supply voltage, the first power switch configured to be closed in the first operation mode and opened in the second operation mode in response to a first power control signal; and
a second power switch connected between the last logic block and the ground voltage, the second power switch configured to be closed in the first operation mode and opened in the second operation mode in response to a second power control signal.

13. A semiconductor device, comprising:
a power gating unit including an output electrode, the power gating unit configured to output an internal signal at the output electrode based on an input signal and an operation mode;
a combinational logic unit including an input electrode directly connected to the output electrode of the power gating unit through a data line, the combinational logic unit configured to generate an output signal based on the internal signal received through the data line; and
a clamping unit configured to at least clamp the internal signal at a logic high level or at a logic low level based on the operation mode, the clamping unit including a first clamping unit connected between the data line and a ground voltage and a second clamping unit connected between the data line and a supply voltage, the first clamping unit and the second clamping unit configured to turn off in a first operation mode, and one of the first clamping unit and the second clamping unit being configured to turn on to clamp the internal signal at the logic low level or at the logic high level in a second operation mode, the first clamping unit including,
a first clamp switch connected to the data line, the first clamp switch configured to be closed or opened in response to a first control signal, and
a second clamp switch connected between the first clamp switch and the ground voltage, the second clamp switch configured to be closed or opened in response to a second control signal, and
the second clamping unit including,
a third clamp switch connected to the data line, the third clamp switch configured to be closed or opened in response to a third control signal, and
a fourth clamp switch connected between the third clamp switch and the supply voltage, the fourth clamp switch configured to be closed or opened in response to a fourth control signal.

14. The semiconductor device of claim 13, wherein the first clamp switch and the second clamp switch are configured to close at different times separated by an interval of a first reference period and are configured to open at different times separated by an interval of a second reference period in the second operation mode while the fourth clamp switch is open, or the third clamp switch and the fourth clamp switch are configured to close at different times separated by an interval of a third reference period and are configured to open at different times separated by an interval of a fourth reference period in the second operation mode while the second clamp switch is kept opened.

* * * * *